US012787583B2

(12) United States Patent
Lee

(10) Patent No.: US 12,787,583 B2
(45) Date of Patent: Nov. 3, 2026

(54) DISPLAY APPARATUS

(71) Applicant: LG Display Co., Ltd., Seoul (KR)

(72) Inventor: Booheung Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/984,538

(22) Filed: Dec. 17, 2024

(65) Prior Publication Data

US 2025/0268038 A1 Aug. 21, 2025

(30) Foreign Application Priority Data

Feb. 20, 2024 (KR) ........................ 10-2024-0024409

(51) Int. Cl.

| | |
|---|---|
| ***H10K 59/131*** | (2023.01) |
| ***G09G 3/3233*** | (2016.01) |
| ***H10K 59/35*** | (2023.01) |
| *H10K 102/00* | (2023.01) |

(52) U.S. Cl.

CPC ......... *H10K 59/131* (2023.02); *G09G 3/3233* (2013.01); *H10K 59/35* (2023.02); *G09G 2300/0426* (2013.01); *G09G 2300/0819* (2013.01); *G09G 2300/0842* (2013.01); *G09G 2300/0861* (2013.01); *H10K 2102/311* (2023.02)

(58) Field of Classification Search

CPC ......... G09G 2300/0426; G09G 3/3233; G09G 3/3266; G09G 3/3659; G09G 3/3677; G09G 3/3648; G09G 2310/0262; G09G 3/32; G09G 2310/0286; G09G 2300/0408; H10K 59/131; G11C 19/28; G11C 19/287; G11C 19/184

See application file for complete search history.

(56) References Cited

U.S. PATENT DOCUMENTS

| | | | | |
|---|---|---|---|---|
| 2016/0210923 | A1* | 7/2016 | Yoshida ............ | G02F 1/133512 |
| 2019/0371880 | A1* | 12/2019 | Ueno ...................... | H05K 1/189 |
| 2022/0199737 | A1* | 6/2022 | Wang ................. | H10K 59/1213 |
| 2024/0373701 | A1* | 11/2024 | Yao ...................... | G09G 3/3266 |

FOREIGN PATENT DOCUMENTS

| | | |
|---|---|---|
| KR | 10-2455584 B1 | 10/2022 |

* cited by examiner

*Primary Examiner* — Sanjiv D. Patel

(74) *Attorney, Agent, or Firm* — Seed Intellectual Property Law Group LLP

(57) ABSTRACT

A display apparatus according to an embodiment of the present disclosure includes a substrate including an active area in which a plurality of pixels is disposed and a non-active area which encloses the active area, a plurality of gate drivers which is distributed in the active area and outputs a gate signal, a flexible substrate connected to one side of the non-active area, a plurality of first gate link lines which is connected to the flexible substrate and a first gate driver, among the plurality of gate drivers, and extends in a first direction and a plurality of second gate link lines which is disposed in the active area, extends in a second direction which is different from the first direction, is connected to the plurality of first gate link lines, and is connected to a first gate driver and a second gate driver, among the plurality of gate drivers.

19 Claims, 13 Drawing Sheets

DISPLAY APPARATUS

CROSS-REFERENCE TO RELATED APPLICATIONS

This application claims the priority of Korean Patent Application No. 10-2024-0024409 filed on Feb. 20, 2024, in the Korean Intellectual Property Office, the disclosure of which is incorporated herein by reference.

BACKGROUND

Technical Field

The present disclosure relates to a display apparatus, and more particularly, to a display apparatus in which a bezel is reduced or minimized.

Description of the Related Art

As technology in modern society develops, display apparatuses are used in various ways to provide information to users. The display apparatuses include not only electronic signs which simply transmit visual information in one direction, but also various electronic devices which require higher level of technology to check user's input and provide information in response to the checked input.

A representative display apparatus may include a liquid crystal display device (LCD), a field emission display device (FED), an electro-wetting display device (EWD), an organic light emitting display device (OLED), and the like.

Among them, the organic light emitting display apparatus is a self-emitting display apparatus so that a separate light source is not necessary, which is different from the liquid crystal display apparatus. Therefore, the organic light emitting display apparatus may be manufactured to have a light weight and a small thickness. Further, since the organic light emitting display apparatus is advantageous not only in terms of power consumption due to the low voltage driving, but also in terms of color implementation, a response speed, a viewing angle, and a contrast ratio (CR), it is expected to be utilized in various fields.

BRIEF SUMMARY

Various embodiments of the present disclosure provide a display apparatus which reduces a bezel.

Various embodiments of the present disclosure provide a display apparatus which improves the delay of a gate control signal.

Technical benefits of the present disclosure are not limited to the above-mentioned benefits, and other benefits, which are not mentioned above, can be clearly understood by those skilled in the art from the following descriptions.

A display apparatus according to an exemplary embodiment of the present disclosure includes a substrate including an active area in which a plurality of pixels is disposed and a non-active area which encloses the active area, a plurality of gate drivers which is distributed in the active area and outputs a gate signal, a flexible substrate connected to one side of the non-active area, a plurality of first gate link lines which is connected to the flexible substrate and a first gate driver, among the plurality of gate drivers, and extends in a first direction and a plurality of second gate link lines which is disposed in the active area, extends in a second direction which is different from the first direction, is connected to the plurality of first gate link lines, and is connected to the first gate driver and a second gate driver, among the plurality of gate drivers.

A display apparatus according to another exemplary embodiment of the present disclosure includes a substrate including an active area in which a plurality of pixels is disposed and a non-active area which encloses the active area, a plurality of gate blocks disposed in the active area in which a plurality of gate drivers which supplies a gate signal to the plurality of pixels is divided to be disposed, a plurality of first gate link lines which is connected to some of the plurality of gate blocks and extends in a first direction and a plurality of second gate link lines which is connected to the plurality of first gate link lines to extend in a second direction which is different from the first direction and is connected to the plurality of gate blocks.

Other detailed matters of the exemplary embodiments are included in the detailed description and the drawings.

According to the present disclosure, a gate driver is disposed in an active area and a pad and each gate driver are directly connected so that a wiring line disposed in the non-active area may be omitted, thereby minimizing a bezel.

According to the present disclosure, the pad and each gate driver are directly connected to reduce the number of wiring lines and reduce a load, thereby improving the signal delay.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
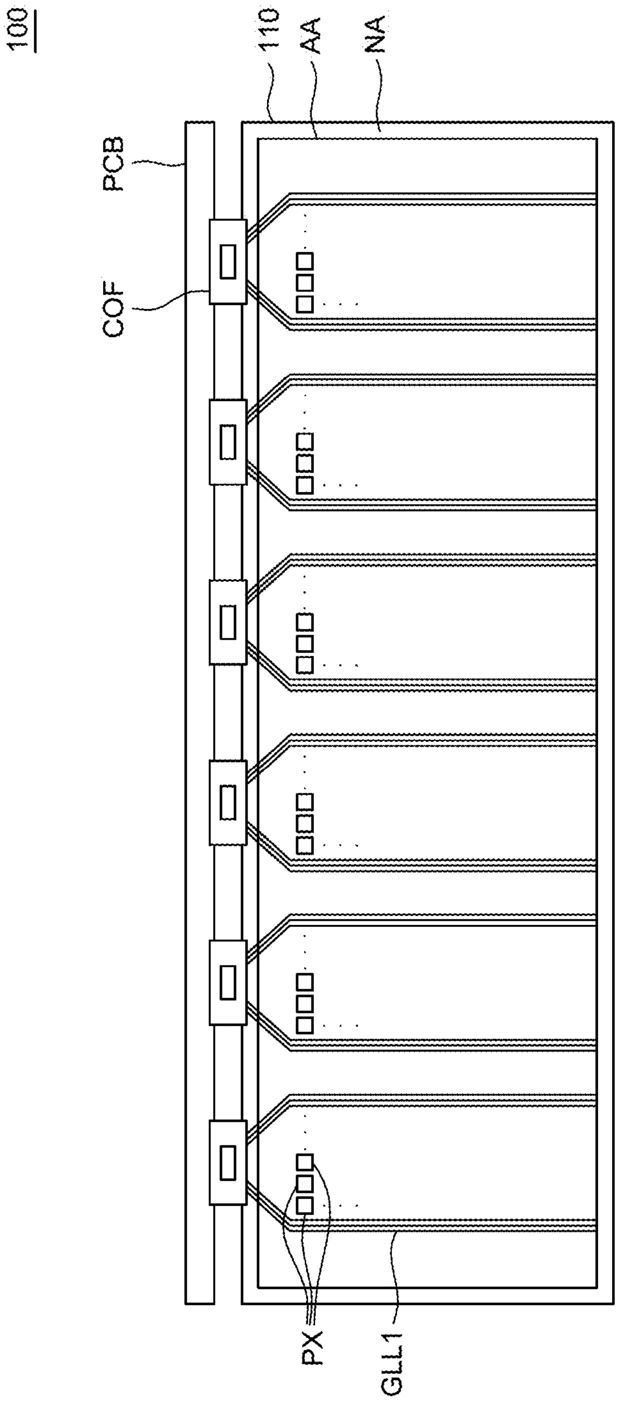
FIG. 1 is an exemplary plan view of a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, dimensions (e.g., length, width, height, thickness, radius, diameter, area, etc.), ratios, angles, numbers, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

In describing components of the exemplary embodiment of the present disclosure, terminologies such as first, second, A, B, (a), (b), and the like may be used. These terminologies are used to distinguish a component from the other component, but a nature, an order, or the number of the components is not limited by the terminology. When a component is "linked," "coupled," or "connected" to another component, the component may be directly linked or connected to the other component. However, unless specifically stated otherwise, it should be understood that a third component may be interposed between the components which may be indirectly linked or connected. Further, the term "connected" used herein encompasses the meaning of both "physically" connected (includes the meaning of directly connected and indirectly connected) and "electrically" connected.

When the position relation between two parts is described using the terms such as "on," "above," "below," and "next," one or more parts may be positioned between the two parts unless the terms are used with the term "immediately" or "directly."

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

The following embodiments will be described focusing on the organic light emitting display device. However, embodiments of the present specification are not limited to organic light emitting display devices and can be applied to various electroluminescent displays. For example, the electroluminescent display apparatus may use an organic light emitting diode (OLED) display apparatus, a quantum dot light emitting diode display apparatus, or an inorganic light emitting diode display apparatus.

Hereinafter, exemplary embodiments of the present disclosure will be described in detail with reference to accompanying drawings.

FIG. 1 is an exemplary plan view of a display apparatus according to an exemplary embodiment of the present disclosure. For the convenience of description, in FIG. 1, among various components of the display apparatus 100, only a plurality of flexible films COF, a printed circuit board PCB, and a substrate 110 are illustrated.

Referring to FIG. 1, the display apparatus 100 includes a plurality of flexible films COF, a printed circuit board PCB, and a substrate 110.

The plurality of flexible films COF may be disposed at one end of the substrate 110. The plurality of flexible films COF is films in which various components are disposed on a base film having a ductility to supply a signal to the plurality of sub pixels and a driving circuit and may be electrically connected to the substrate 110. For example, the plurality of flexible films COF may supply a power voltage, a gate control signal, and a data voltage to the plurality of sub pixels and the driving circuit.

In the meantime, a driving IC, such as a data driver IC, may be disposed on the plurality of flexible films COF. The driving IC is a component which processes data for displaying images and a driving signal for processing the data. The driving IC may be disposed in a chip on glass (COG), a chip on film (COF), or a tape carrier package (TCP) manner depending on a mounting method. However, for the convenience of description, it is described that the driving IC is mounted on the plurality of flexible films COF by a chip on film technique, but is not limited thereto. Further, the driving IC may be integrated with the timing controller to be disposed as a single chip. In the meantime, even though it is illustrated that six flexible films COF are disposed in FIG. 1, it is not limited thereto. Also, the number of the plurality of flexible films COF may vary depending on the design, but is not limited thereto.

The printed circuit board PCB is electrically connected to the plurality of flexible films COF. The printed circuit board PCB is a component which supplies signals to the driving IC. Various components may be disposed in the printed circuit board PCB to supply various signals such as a driving signal or a data signal to the driving IC. In the meantime, even though it is illustrated that a plurality of flexible films COF is electrically connected to one printed circuit board PCB, the present disclosure is not limited thereto. A plurality of flexible films COF is electrically connected to a plurality of printed circuit boards PCB, respectively.

The substrate 110 is a base member which supports various components of the display apparatus 100 and may be configured by an insulating material. For example, the substrate 110 may be formed of plastic such as polyimide (PI) or glass, but is not limited thereto.

The substrate 110 may have an active area AA and a non-active area NA enclosing the active area AA.

The active area AA is an area where images are displayed. The active area AA may include a plurality of pixels PX disposed in a row direction and a column direction to display images. The plurality of pixels PX may be disposed in an area in which a plurality of data lines and a plurality of gate lines intersect. The plurality of pixels PX is configured by a plurality of sub pixels including a light emitting diode and a driving circuit to display images. One pixel PX may include a plurality of sub pixels which emits different color light. For example, the pixel PX uses three sub pixels to implement blue, red, and green. However, this is not limited thereto and in some cases, the pixel PX may further include a sub pixel for further implementing a specific color (for example, white). In the pixel PX, an area which implements blue is referred to as a blue sub pixel, an area which implements red is referred to as a red sub pixel, and an area which implements green may be referred to as a green sub pixel.

The non-active area NA is an area where no image is displayed and various wiring lines, etc., for driving the plurality of pixels PX disposed in the active area AA are disposed. The non-active area may be referred to as a bezel area. A plurality of pads may be disposed in a non-active area NA located at an upper end of the substrate 110 among the non-active areas NA. The plurality of flexible film COF may be connected to the pad.

In the substrate 110, a plurality of first gate link lines GLL1 extending in the first direction may be disposed.

The plurality of first gate link lines GLL1 may be disposed on the substrate 110 in the column direction. The plurality of first gate link lines GLL1 may supply a gate control signal, such as a clock signal, a gate high signal, and a gate low signal, to control the gate driver. The plurality of first gate link lines GLL1 may be disposed in the non-active area NA and the active area AA. The plurality of first gate link lines GLL1 may be connected to the flexible substrate COF and the plurality of gate drivers. The plurality of first gate link lines GLL1 may be connected to the pad connected to the flexible substrate COF and a first gate driver or some gate drivers, among the plurality of gate drivers disposed in the active area AA. The plurality of first gate link lines GLL1 extends from the pad of the non-active area NA to which the flexible substrate COF is connected to a lower end of the active area AA.

Figure 2:
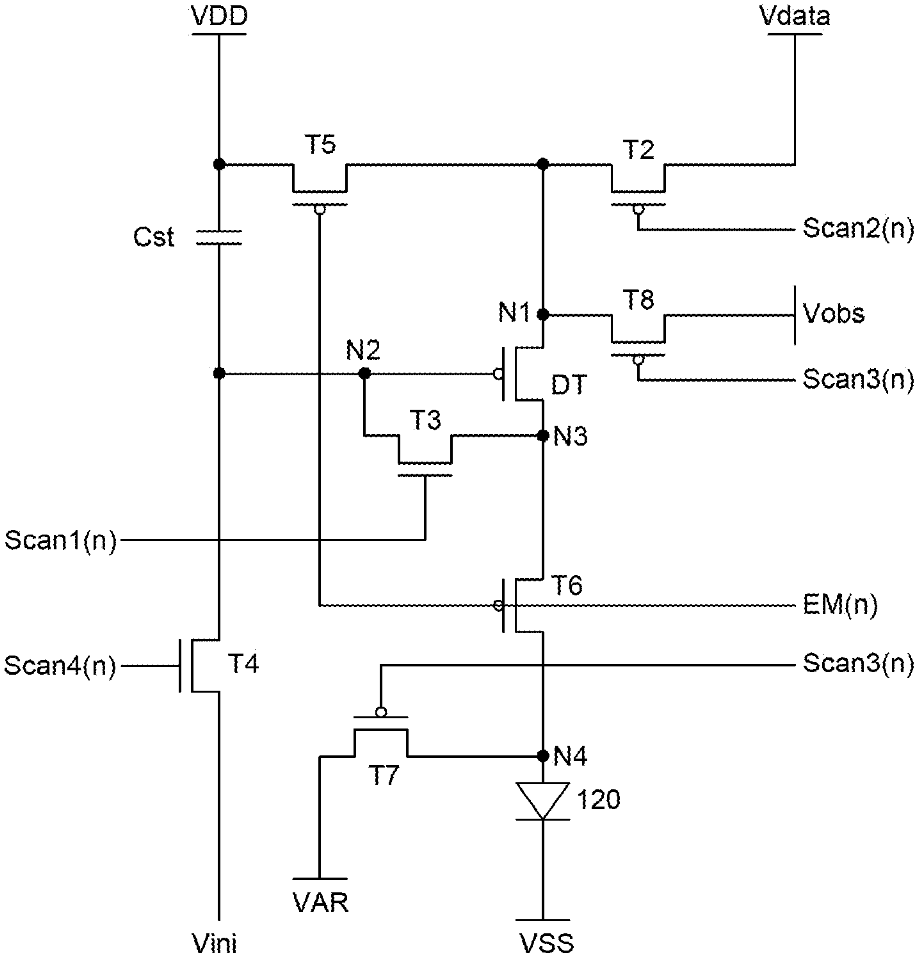
FIG. 2 is an exemplary circuit diagram of a sub pixel circuit of a display apparatus according to an exemplary embodiment of the present disclosure.

FIG. 2 is an exemplary circuit diagram of a sub pixel circuit of a display apparatus according to an exemplary embodiment of the present disclosure.

Referring to FIG. 2, a sub pixel circuit may include a light emitting diode 120, a driving transistor DT, a second transistor T2, a third transistor T3, a fourth transistor T4, a fifth transistor T5, a sixth transistor T6, a seventh transistor T7, an eighth transistor T8, and a storage capacitor Cst.

The light emitting diode 120 may emit light by a driving current supplied from the driving transistor DT. An anode electrode of the light emitting diode 120 is connected to a fourth node N4 and a cathode electrode of the light emitting diode may be connected to a low potential power line to which a low potential power voltage VSS is supplied.

The driving transistor DT controls a driving current applied to the light emitting diode 120 in accordance with a source-gate voltage Vsg. The driving transistor DT may be implemented by a p-type MOSFET (PMOS) or a low temperature polycrystalline silicon (LTPS) thin film transistor. Further, a source electrode of the driving transistor DT is connected to a first node N1, a gate electrode is connected to a second node N2, and a drain electrode may be connected to a third node N3. The driving transistor DT may be referred to as a first transistor.

The second transistor T2 applies a data voltage Vdata supplied from a data line to a first node N1 which is the source electrode of the driving transistor DT. The second transistor T2 may be a p-type MOSFET (PMOS) or may be implemented by a low temperature polycrystalline silicon (LTPS) thin film transistor. The second transistor T2 may include a source electrode connected to the data line, a drain electrode connected to the first node N1, and a gate electrode connected to a second scan signal line which transmits a second scan signal Scan2(*n*). Accordingly, the second transistor T2 applies a data voltage Vdata supplied from the data line to the first node N1 which is the source electrode of the driving transistor DT, in response to a low level of second scan signal Scan2(*n*) which is a turn-on voltage.

The third transistor T3 diode-connects the gate electrode and the drain electrode of the driving transistor DT. The third transistor T3 may be an n-type MOSFET (NMOS) and may be implemented by an oxide thin film transistor to reduce or minimize a leakage current during a turn-off period. The third transistor T3 may include a drain electrode or a source electrode connected to the third node N3, a source electrode or a drain electrode connected to the second node N2, and a gate electrode connected to a first scan signal line which transmits a first scan signal Scan1(*n*). Therefore, the third transistor T3 diode-connects the gate electrode and the drain electrode of the driving transistor DT in response to a high level of first scan signal Scan1(*n*) which is a turn-on voltage.

The fourth transistor T4 applies an initialization signal Vini to the second node N2 which is the gate electrode of the driving transistor DT. The fourth transistor T4 may be an n-type MOSFET (NMOS) and may be implemented by an oxide thin film transistor. The fourth transistor T4 may include a source electrode connected to an initialization signal line which transmits an initialization signal Vini, a drain electrode connected to the second node N2, and a gate electrode connected to a fourth scan signal line which transmits a fourth scan signal Scan4(*n*). Accordingly, the fourth transistor T4 applies the initialization signal Vini to the second node N2 which is the gate electrode of the driving transistor DT, in response to a high level of fourth scan signal Scan4(*n*) which is a turn-on voltage.

The fifth transistor T5 applies a high potential power voltage VDD to the first node N1 which is the source electrode of the driving transistor DT. The fifth transistor T5 may be a p-type MOSFET (PMOS) or may be implemented by a low temperature polycrystalline silicon (LTPS) thin film transistor. The fifth transistor T5 includes a source electrode connected to a high potential power voltage line which transmits a high potential power voltage VDD, a drain electrode connected to the first node N1, and a gate electrode connected to an emission signal line which transmits an emission signal EM(n). Accordingly, the fifth transistor T5 applies the high potential power voltage VDD to the first node N1 which is the source electrode of the driving transistor DT, in response to a low level of emission signal EM(n) which is a turn-on voltage.

The sixth transistor T6 forms a current path between the driving transistor DT and the light emitting diode 120. The sixth transistor T6 may be a p-type MOSFET (PMOS) or may be implemented by a low temperature polycrystalline silicon (LTPS) thin film transistor. The sixth transistor T6 includes a source electrode connected to the third node N3, a drain electrode connected to the fourth node N4, and a gate electrode connected to the emission signal line which transmits an emission signal EM(n). The sixth transistor T6 forms a current path between the third node N3 which is the source electrode of the sixth transistor T6 and the fourth node N4 which is the drain electrode of the sixth transistor T6, in response to the emission signal EM(n). Accordingly, the sixth transistor T6 forms a current path between the driving transistor DT and the light emitting diode 120 in response to a low level of emission signal EM(n) which is a turn-on voltage.

The seventh transistor T7 applies a reset voltage VAR to the fourth node N4 which is an anode of the light emitting diode 120. The seventh transistor T7 may be a p-type MOSFET (PMOS) or may be implemented by a low temperature polycrystalline silicon (LTPS) thin film transistor. The seventh transistor T7 may include a source electrode connected to a reset voltage line which transmits a reset voltage VAR, a drain electrode connected to the fourth node N4, and a gate electrode connected to a third scan signal line which transmits a third scan signal Scan3(*n*). Accordingly, the seventh transistor T7 applies the reset voltage VAR to the fourth node N4 which is the anode of the light emitting diode 120, in response to a low level of third scan signal Scan3(*n*) which is a turn-on level and is supplied to a (n)-th pixel line.

The eighth transistor T8 applies an on-bias stress voltage Vobs to the first node N1 which is the source electrode of the driving transistor DT. The eighth transistor T8 may be a p-type MOSFET (PMOS) or may be implemented by a low temperature polycrystalline silicon (LTPS) thin film transistor. The eighth transistor T8 includes a source electrode connected to an on-bias stress voltage line which transmits an on-bias stress voltage Vobs, a drain electrode connected to the first node N1, and a gate electrode connected to a third scan signal line which transmits a third scan signal Scan3(*n*). Accordingly, the eighth transistor T8 applies the on-bias stress voltage Vobs to the first node N1 which is the source electrode of the driving transistor DT, in response to a low level of third scan signal Scan3(*n*) which is a turn-on level.

The storage capacitor Cst maintains a data voltage Vdata stored in each sub pixel for one frame. The storage capacitor Cst includes a first electrode connected to the second node N2 and a second electrode connected to the high potential power voltage line which transmits a high potential power voltage VDD. That is, one electrode of the storage capacitor Cst is connected to the gate electrode of the driving transistor DT and the other electrode of the storage capacitor Cst is connected to the high potential power voltage line which transmits the high potential power voltage VDD.

Figure 3:
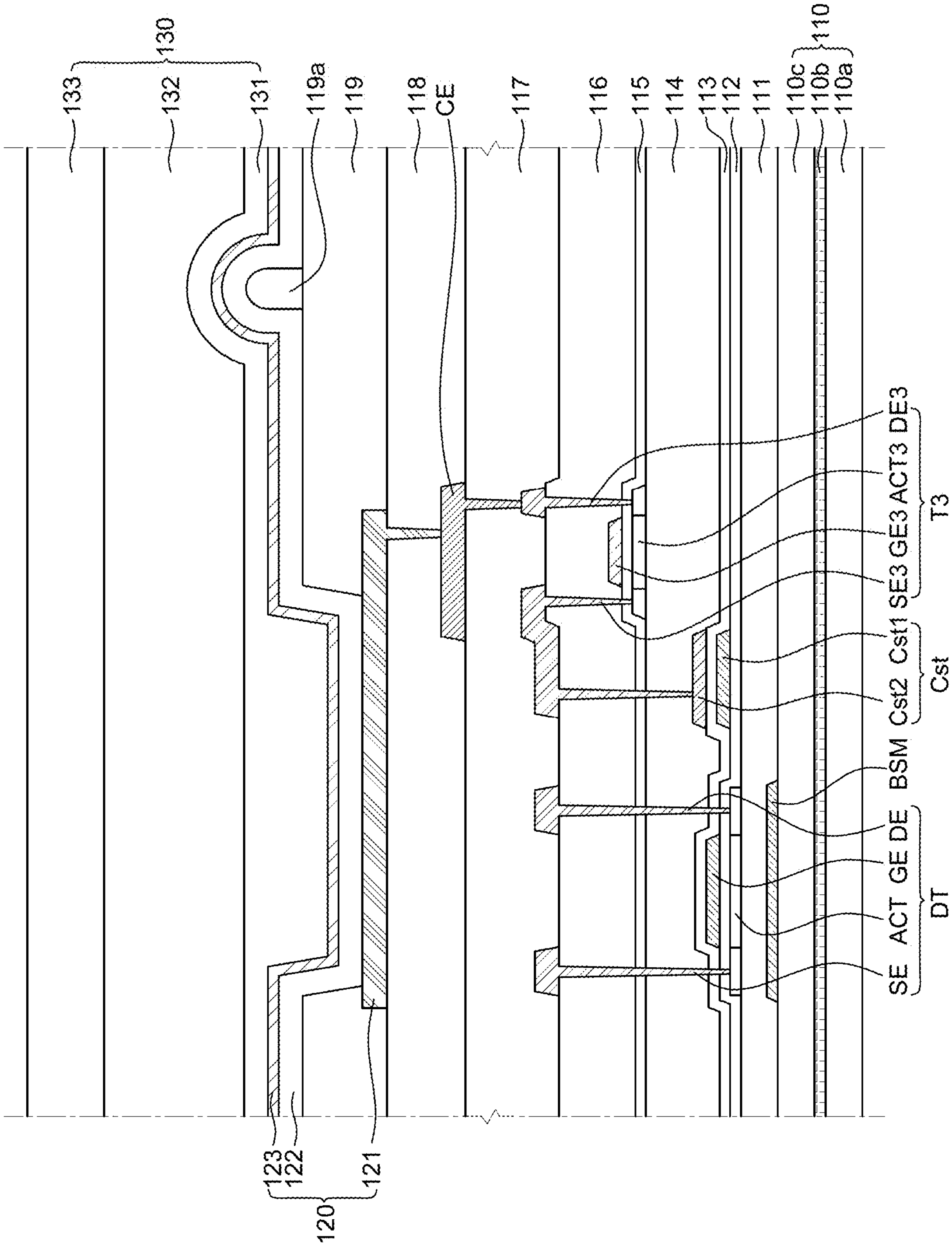
FIG. 3 is a cross-sectional view of a display apparatus according to an exemplary embodiment of the present disclosure.

FIG. 3 is a cross-sectional view of a display apparatus according to an exemplary embodiment of the present disclosure. In FIG. 3, for the convenience of description, among various components of the display apparatus 100 according to the exemplary embodiment of the present disclosure, only a substrate 110, a driving transistor DT, a storage capacitor Cst, a lower protection metal layer BSM, a first buffer layer 111, a first gate insulating layer 112, a first interlayer insulating layer 113, a second buffer layer 114, a third transistor T3, a second gate insulating layer 115, a second interlayer insulating layer 116, a first planarization layer 117, a connection electrode CE, a second planarization layer 118, a light emitting diode 120, a bank layer 119, a spacer 119*a*, and an encapsulation layer 130 are illustrated.

Referring to FIG. 3, the display apparatus 100 according to another exemplary embodiment of the present disclosure may include a substrate 110, a driving transistor DT, a storage capacitor Cst, a lower protection metal layer BSM, a first buffer layer 111, a first gate insulating layer 112, a first interlayer insulating layer 113, a second buffer layer 114, a third transistor T3, a second gate insulating layer 115, a second interlayer insulating layer 116, a first planarization layer 117, a connection electrode CE, a second planarization layer 118, a light emitting diode 120, a bank layer 119, a spacer 119*a*, and an encapsulation layer 130.

The substrate 110 is a base member which supports various components of the display apparatus 100 and may be configured by an insulating material. For example, the substrate 110 may be formed of glass or a plastic material, but is not limited thereto. When the substrate 110 is formed of a plastic material, for example, the substrate may be formed of polyimide (PI). When the substrate 110 is formed of polyimide (PI), moisture components pass through the substrate 110 formed of polyimide (PI) to permeate the driving transistor DT or the light emitting diode 120 so that the performance of the display apparatus 100 may be deteriorated.

The display apparatus 100 according to the exemplary embodiment of the present disclosure may be configured by a double polyimide (PI) to suppress the deterioration of the performance of the display apparatus 100 due to the moisture permeation. Further, an inorganic layer is formed between two polyimide (PI) to block the moisture components from passing through the lower polyimide (PI), so that the reliability of the product performance may be improved. For example, the substrate 110 may include a first plastic substrate 110*a*, a second plastic substrate 110*c*, and an inorganic layer 110*b* formed between the first plastic substrate 110*a* and the second plastic substrate 110*c*. The first plastic substrate 110*a* is referred to as a first organic layer and the second plastic substrate 110*c* is referred to as a second organic layer. When the charges are charged in the first plastic substrate 110*a*, the inorganic layer 110*b* may serve to block the charges from affecting the driving transistor DT through the second plastic substrate 110*c*. Further, the inorganic layer 110*b* formed between the first plastic substrate 110*a* and the second plastic substrate 110*c* may serve to block the moisture component from penetrating through the first plastic substrate 110*a*. The inorganic layer 110*b* may be formed by a single layer of silicon nitride (SiNx) or silicon oxide (SiOx) or a multi-layer thereof, but is not limited thereto.

The lower protection metal layer BSM may be disposed on the substrate 110.

The lower protection metal layer BSM is disposed below the driving transistor DT so as to overlap the active layer ACT of the driving transistor DT to block moisture entering from the outside, potentials generated on the surface of the substrate 110, and light entering from the outside, such as laser irradiated during a laser release process. For example, the lower protection metal layer BSM may be formed by any one of molybdenum (Mo), copper (Cu), titanium (Ti), aluminum (Al), chrome (Cr), gold (Au), nickel (Ni), and neodymium (Nd) or an alloy thereof. Even though in FIG. 3, it is illustrated that the lower protection metal layer BSM is disposed below the active layer ACT of the driving transistor DT, it is not limited thereto and if necessary, may be disposed below semiconductor layers of all the transistors.

The first buffer layer 111 may be disposed on the substrate 110 and the lower protection metal layer BSM. The first buffer layer 111 may be formed on an entire surface of the substrate 110. The first buffer layer 111 may be formed by a single layer of silicon nitride (SiNx) or silicon oxide (SiOx) or a multi-layer thereof. The first buffer layer 111 may enhance an adhesiveness between layers formed on the first buffer layer 111 and the substrate 110. Further, the first buffer layer 111 is not an essential component and may be omitted based on a type or a material of the substrate 110 and a structure and a type of a transistor.

The driving transistor DT may be disposed on the first buffer layer 111. The driving transistor DT may include an active layer ACT, a gate electrode GE, a source electrode SE, and a drain electrode DE. The active layer ACT of the driving transistor DT may be disposed on the first buffer layer 111.

The active layer ACT may be formed of a semiconductor material, such as an oxide semiconductor, amorphous silicon, or polysilicon, but is not limited thereto.

The first gate insulating layer 112 may be disposed on the active layer ACT of the driving transistor DT. The first gate insulating layer 112 may be configured as a single layer of silicon nitride (SiNx) or silicon oxide (SiOx) or a multi-layer thereof. A contact hole may be formed in the first gate insulating layer 112 to allow each of the source electrode SE and the drain electrode DE of the driving transistor DT to be connected to the active layer ACT of the driving transistor DT.

The gate electrode GE of the driving transistor DT may be disposed on the first gate insulating layer 112. The gate electrode GE may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The gate electrode GE may be formed on the first gate insulating layer 112 so as to overlap the active layer ACT of the driving transistor DT.

The first interlayer insulating layer 113 may be disposed on the first gate insulating layer 112 and the gate electrode GE. The first interlayer insulating layer 113 may be configured by a single layer of silicon nitride (SiNx) or silicon oxide (SiOx) or a multi-layer thereof. A contact hole may be formed in the first interlayer insulating layer 113 to expose the active layer ACT of the driving transistor DT.

The second buffer layer 114 may be disposed on the first interlayer insulating layer 113. The second buffer layer 114 may be formed on an entire surface of the substrate 110. The second buffer layer 114 may be formed by a single layer of silicon nitride (SiNx) or silicon oxide (SiOx) or a multi-layer thereof. A contact hole may be formed in the second buffer layer 114 to expose the active layer ACT of the driving transistor DT.

The third transistor T3 may be disposed on the second buffer layer 114. The third transistor T3 may include a third active layer ACT3, a third gate electrode GE3, a third source electrode SE3, and a third drain electrode DE3. The third active layer ACT3 of the third transistor T3 may be disposed on the second buffer layer 114.

The third active layer ACT3 may be formed of an oxide semiconductor. For example, the third active layer ACT3 may be formed of metal oxide and for example, may be formed of various metal oxides such as indium-gallium-zinc-oxide (IGZO). Under assumption that the third active layer ACT3 of the third transistor T3 is formed of IGZO, among various metal oxides, it has been described that the active layer is formed based on the IGZO layer, but it is not limited thereto. Therefore, the active layer may be formed of another metal oxide such as indium-zinc-oxide (IZO), indium-gallium-tin-oxide (IGTO), or indium-gallium-oxide (IGO), other than IGZO.

The second gate insulating layer 115 may be disposed on the third active layer ACT3 of the third transistor T3. The second gate insulating layer 115 may be configured by a single layer of silicon nitride (SiNx) or silicon oxide (SiOx) or a multi-layer thereof. In the second gate insulating layer 115, a contact hole through which the third source electrode SE3 and the third drain electrode DE3 of the third transistor T3 are connected to the third active layer ACT3 of the third transistor T3 may be formed.

The third gate electrode GE3 of the third transistor T3 may be disposed on the second gate insulating layer 115. The third gate electrode GE3 may be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The third gate electrode GE3 may be formed on the second gate insulating layer 115 so as to overlap the third active layer ACT3 of the third transistor T3. A contact hole may be formed in the second gate insulating layer 115 to expose the active layer ACT of the driving transistor DT and the third active layer ACT3 of the third transistor T3.

The second interlayer insulating layer 116 may be disposed on the second gate insulating layer 115 and the third gate electrode GE3. The second interlayer insulating layer 116 may be configured by a single layer of silicon nitride (SiNx) or silicon oxide (SiOx) or a multi-layer thereof. A contact hole may be formed in the second interlayer insulating layer 116 to expose the active layer ACT of the driving transistor DT and the third active layer ACT3 of the third transistor T3.

On the second interlayer insulating layer 116, the source electrode SE and the drain electrode DE of the driving transistor DT and the third source electrode SE3 and the third drain electrode DE3 of the third transistor T3 may be disposed.

The source electrode SE and the drain electrode DE of the driving transistor DT may be connected to the active layer ACT of the driving transistor DT through contact holes formed in the first gate insulating layer 112, the first interlayer insulating layer 113, the second buffer layer 114, the second gate insulating layer 115, and the second interlayer insulating layer 116. Accordingly, the source electrode SE of the driving transistor DT may be connected to a first source region of the active layer ACT through contact holes formed in the first gate insulating layer 112, the first interlayer insulating layer 113, the second buffer layer 114, the second gate insulating layer 115, and the second interlayer insulating layer 116. Further, the drain electrode DE of the driving transistor DT may be connected to a first drain region of the active layer ACT through contact holes formed in the first gate insulating layer 112, the first interlayer insulating layer 113, the second buffer layer 114, the second gate insulating layer 115, and the second interlayer insulating layer 116.

The third source electrode SE3 and the third drain electrode DE3 of the third transistor T3 may be connected to the third active layer ACT3 of the third transistor T3 through contact holes formed in the second gate insulating layer 115 and the second interlayer insulating layer 116. Therefore, the third source electrode SE3 of the third transistor T3 may be connected to a third source region of the third active layer ACT3 through the contact holes formed in the second gate insulating layer 115 and the second interlayer insulating layer 116. Further, the third drain electrode DE3 of the third transistor T3 may be connected to a third drain region of the third active layer ACT3 through the contact holes formed in the second gate insulating layer 115 and the second interlayer insulating layer 116.

The storage capacitor Cst may include a first capacitor electrode Cst1 and a second capacitor electrode Cst2.

The first capacitor electrode Cst1 may be disposed on the first gate insulating layer 112. The first capacitor electrode Cst1 may be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The first capacitor electrode Cst1 may be formed of the same material as the gate electrode GE of the driving transistor DT, but is not limited thereto.

The second capacitor electrode Cst2 may be disposed on the first interlayer insulating layer 113. The second capacitor electrode Cst2 may be disposed on the first interlayer insulating layer 113 so as to overlap the first capacitor electrode Cst1. For example, the second capacitor electrode Cst2 may be formed by a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof.

The passivation layer may be disposed on the source electrode SE and the drain electrode DE of the driving transistor DT, the third source electrode SE3 and the third drain electrode DE3 of the third transistor T3, and the second interlayer insulating layer 116. The passivation layer is an insulating layer which protects elements therebelow and may be configured by a single layer of silicon nitride (SiNx) or silicon oxide (SiOx) or a multi-layer thereof.

The first planarization layer 117 may be disposed on the second interlayer insulating layer 116. The first planarization layer 117 is provided to relieve a step of a lower structure. The first planarization layer may be formed of an organic material, such as acrylic-based resin, epoxy resin, phenol resin, polyamide-based resin, polyimide-based resin, unsaturated polyester-based resin, polyphenylene-based resin, polyphenylene sulfide-based resin, benzocyclobutene, or photoresist, but is not limited thereto.

The connection electrode CE may be disposed on the first planarization layer 117. The connection electrode CE may be electrically connected to the third drain electrode DE3 of the third transistor T3 through a contact hole formed in the first planarization layer 117. The connection electrode CE may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof.

The second planarization layer 118 may be disposed on the connection electrode CE and the first planarization layer 117. The second planarization layer 118 is provided to relieve a step of a lower structure. The second planarization layer may be formed of an organic material, such as acrylic-based resin, epoxy resin, phenol resin, polyamide-based resin, polyimide-based resin, unsaturated polyester-based resin, polyphenylene-based resin, polyphenylene sulfide-based resin, benzocyclobutene, or photoresist, but is not limited thereto.

The light emitting diode 120 may be disposed on the second planarization layer 118. The light emitting diode 120 may include a first electrode 121, an emission structure 122, and a second electrode 123.

The first electrode 121 may be disposed on the second planarization layer 118. The first electrode 121 is an anode electrode and may be electrically connected to the connection electrode CE through a contact hole.

The bank layer 119 may be disposed on the first electrode 121 and the second planarization layer 118.

An opening may be formed in the bank layer 119 to expose the first electrode 121. Since the bank layer 119 defines an emission area of the display apparatus 100, the bank layer 119 may also be referred to as a pixel definition layer. For example, the bank layer 119 may be formed of an organic material, such as acrylic-based resin, epoxy resin, phenol resin, polyamide-based resin, polyimide-based resin, unsaturated polyester-based resin, polyphenylene-based resin, polyphenylene sulfide-based resin, benzocyclobutene, or photoresist, but is not limited thereto.

A spacer **119*a* may be further disposed on the bank layer 119. The spacer 119*a* may serve to support a mask when the mask is aligned on the bank layer 119 in a process for depositing the first electrode 121. The spacer 119*a* may be integrally configured with the bank layer 119. For example, the spacer 119*a*** is formed of an organic material, such as acrylic-based resin, epoxy resin, phenol resin, polyamide-based resin, polyimide-based resin, unsaturated polyester-based resin, polyphenylene-based resin, polyphenylene sulfide-based resin, benzocyclobutene, or photoresist, but is not limited thereto.

The emission structure 122 may be disposed on the first electrode 121. The emission structure 122 may include a material which emits light of a specific color. For example, the emission structure 122 may include an emission material which emits any one of red light, green light, and blue light. Specifically, the emission structure 122 may include at least one of a hole injection layer (HIL), a hole transport layer (HTL), an emission layer (EML), an electron transport layer (ETL), and an electron injection layer (EIL). Some components of the emission structure 122 may be omitted depending on the structure or the characteristic of the display apparatus 100.

The second electrode 123 may be further disposed on the emission structure 122, the bank layer 119, and the spacer **119*a*. The second electrode 123 is a cathode electrode and may be disposed on the emission structure 122. The second electrode 123 supplies electrons to the emission structure 122. The second electrode 123** is formed of a transparent conductive oxide such as indium tin oxide or indium zinc oxide or a transparent conductive material such as ytterbium (Yb), but is not limited thereto.

The encapsulation layer 130 is disposed on the second electrode 123. The encapsulation layer 130 may protect the light emitting diode 120 from the moisture and oxygen. When the light emitting diode 120 is exposed to the moisture or oxygen, the pixel shrinkage phenomenon in which the light emitting diode 120 is shrunk is caused or a dark spot may be generated in the emitting emission. For example, the encapsulation layer 130 may include a first inorganic encapsulation layer 131, an organic encapsulation layer 132 on the first inorganic encapsulation layer 131, and a second inorganic encapsulation layer 133 on the organic encapsulation layer 132. The first inorganic encapsulation layer 131 and the second inorganic encapsulation layer 133 may be formed by inorganic insulating layers. For example, the first inorganic encapsulation layer 131 and the second inorganic encapsulation layer 133 may be formed of an inorganic insulating material such as silicon nitride (SiNx), silicon oxide (SiOx), silicon oxynitride (SiON), or aluminum oxide (Al2O3). The organic encapsulation layer 132 may be formed as an organic insulating layer. The second inorganic encapsulation layer 133 covers upper surfaces and side surfaces of the first inorganic encapsulation layer 131 and the organic encapsulation layer 132. The second inorganic encapsulation layer 133 reduces or minimizes or blocks external moisture or oxygen from permeating the first inorganic encapsulation layer 131 and the organic encapsulation layer 132. At this time, the first inorganic encapsulation layer 131 and the second inorganic encapsulation layer 133 serve to block the permeation of moisture or oxygen and the organic encapsulation layer 132 serves to planarize an upper portion of the first inorganic encapsulation layer 131.

Figure 4:
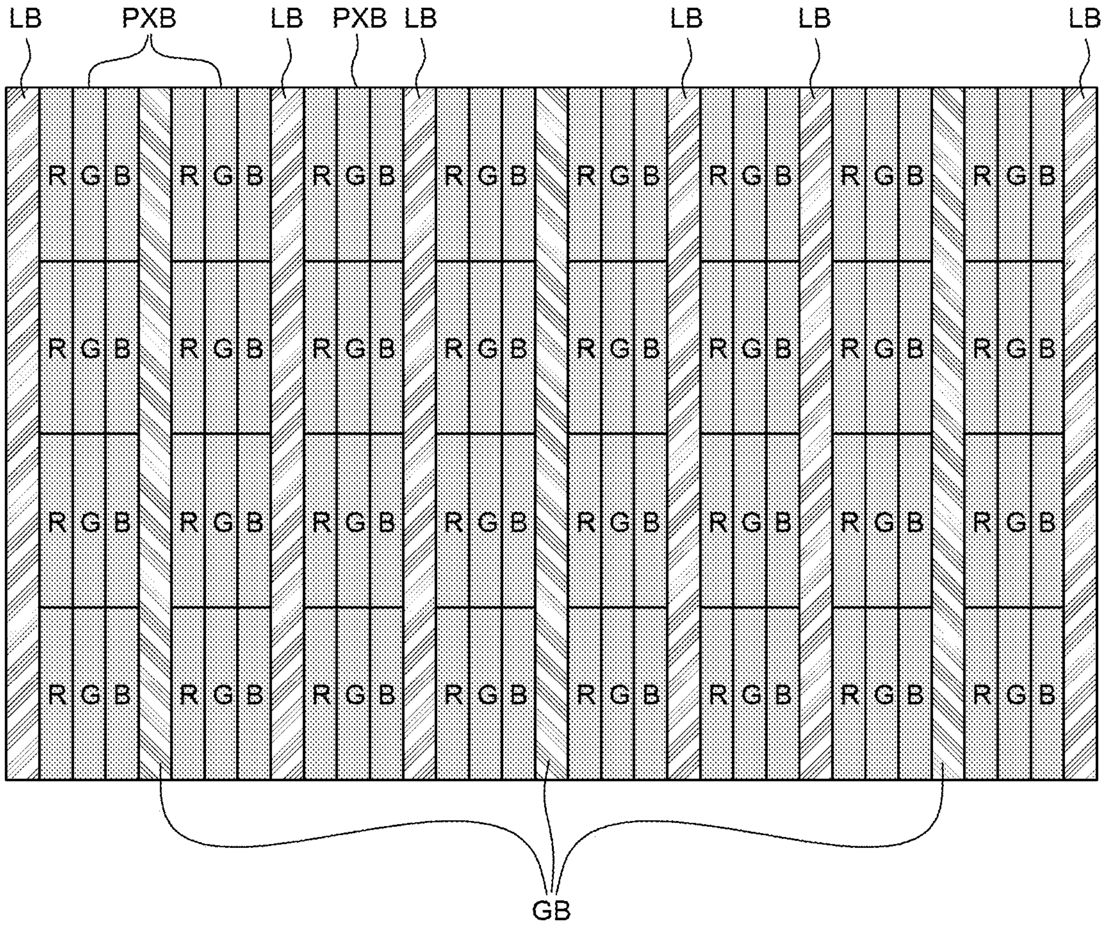
FIG. 4 is a plan view for explaining a part of an active area of a display apparatus according to an exemplary embodiment of the present disclosure.

FIG. 4 is a plan view for explaining a part of an active area of a display apparatus according to an exemplary embodiment of the present disclosure. In FIG. 4, for the convenience of description, only a plurality of pixel blocks PXB, a plurality of gate blocks GB, and a plurality of line blocks LB which are disposed in the active area are illustrated. In FIG. 4, only a plurality of gate blocks GB in which one gate driver, among a plurality of gate drivers is divided to be disposed is illustrated.

A display apparatus 100 according to an exemplary embodiment of the present disclosure includes a plurality of gate drivers.

The plurality of gate drivers includes a first scan driver, a second scan driver, a third scan driver, a fourth scan driver, and an emission driver which output scan signals and emission signals in response to the gate control signal. The plurality of gate drivers receives a clock signal and a gate control signal to generate and output a signal which turns on or turns off transistors disposed on the substrate 110. For example, the first scan driver, the second scan driver, the third scan driver, the fourth scan driver, and the emission driver may output low level voltage or a high level voltage of a first scan signal Scan1(*n*), a second scan signal Scan2(*n*), a third scan signal Scan3(*n*), a fourth scan signal Scan4(*n*), and an emission signal EM(n), respectively, to transistors disposed in each sub pixel.

Referring to FIG. 4, in the active area AA of the display apparatus 100 according to the exemplary embodiment of the present disclosure, a plurality of pixel blocks PXB, a plurality of gate blocks GB, and a plurality of line blocks LB may be disposed.

The plurality of pixel blocks PXB is areas in which pixels PX are disposed and may be disposed in the active area AA in a column direction and a row direction. For example, the pixel block PXB may include a red sub pixel R, a green sub pixel G, and a blue sub pixel B.

The plurality of gate blocks GB is areas in which a plurality of gate drivers is divided to be disposed and may be disposed in the active area AA in the column direction. The plurality of gate blocks GB may be disposed to be parallel to the plurality of pixel blocks PXB disposed in the active area AA in the column direction. The plurality of gate blocks GB may be disposed between the plurality of pixel blocks PXB disposed in the active area AA in the column direction. For example, one gate driver is divided to be disposed in three gate blocks GB, but, it is not limited thereto. In the plurality of gate blocks GB, a plurality of gate control signal lines which transmits a gate control signal may be disposed. For example, the plurality of gate control signal lines may include a clock line which transmits a clock signal, a gate low line which transmits a gate low signal, and a gate high line which transmits a gate high signal.

The plurality of line blocks LB is areas in which a pixel PX is not disposed and may be disposed in the active area AA in the column direction. The plurality of line blocks LB may be disposed to be parallel to the plurality of pixel blocks PXB disposed in the active area AA in the column direction. The plurality of line blocks LB may be disposed between the plurality of pixel blocks PXB disposed in the active area AA in the column direction.

In the plurality of line blocks LB, a plurality of power lines which transmits a power voltage to the plurality of sub pixels may be disposed. For example, the plurality of power lines may include a high potential power voltage line which transmits a high potential power voltage VDD and a low potential power voltage line which transmits a low potential power voltage VSS.

In the active area AA, the plurality of pixel blocks PXB, the plurality of gate blocks GB, and the plurality of line blocks LB may be alternately disposed in the row direction. For example, a gate block GB, a pixel block PXB, a line block LB, a pixel block PXB, a line block LB, and a pixel block PXB may be repeatedly disposed in this order from the left side of the active area AA. However, it is not limited thereto and the placement order may be changed in various forms depending on the design.

Figure 5:
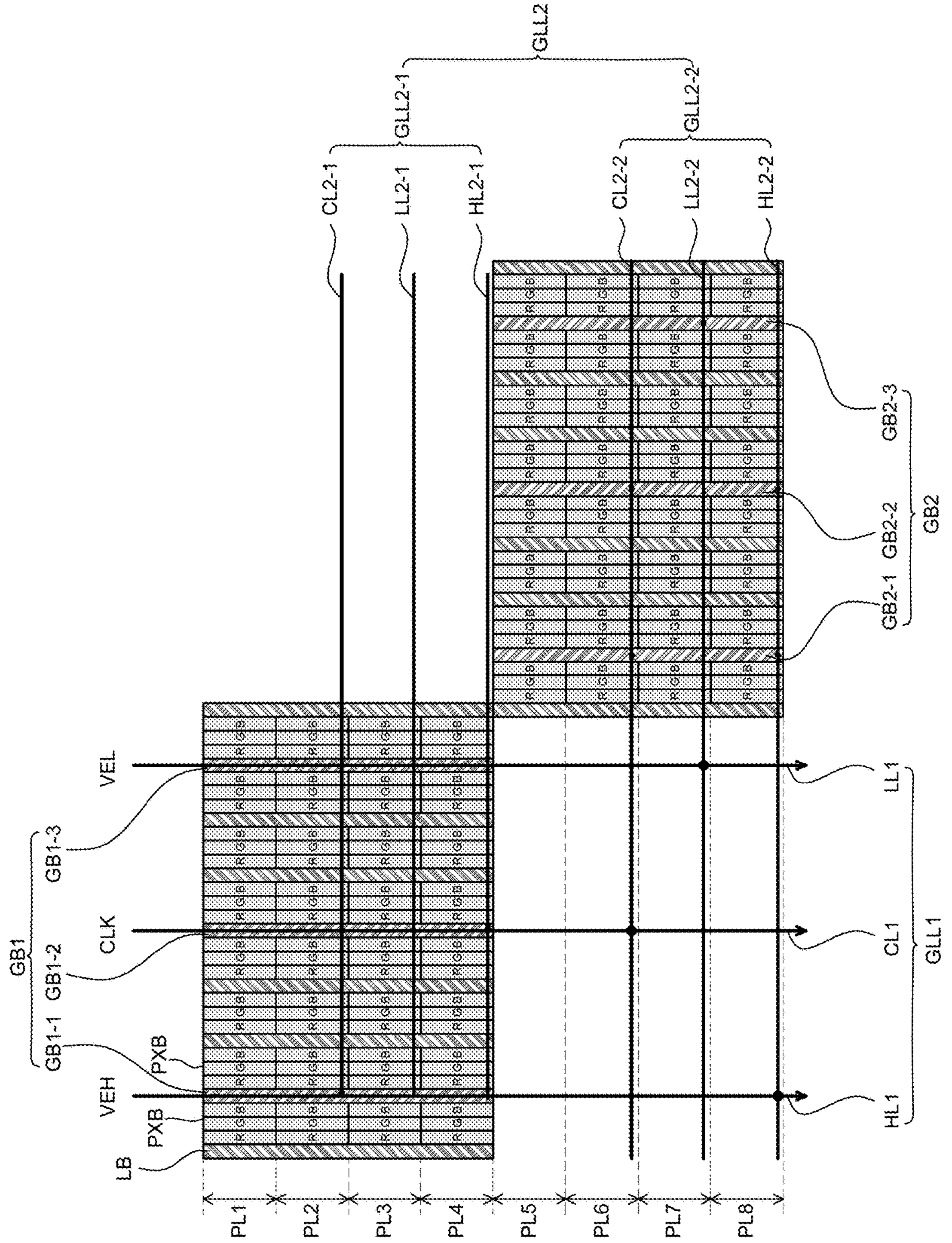
FIG. 5 is a schematic view for explaining a part of an active area of a display apparatus according to an exemplary embodiment of the present disclosure.

FIG. 5 is a schematic view for explaining a part of an active area of a display apparatus according to an exemplary embodiment of the present disclosure. In FIG. 5, for the convenience of description, only a plurality of line blocks LB, a plurality of pixel blocks PXB, a first gate block GB1, a second gate block GB2, a plurality of first gate link lines GLL1, and a plurality of second gate link lines GLL2 are illustrated. In FIG. 5, among the plurality of gate drivers, an emission driver is illustrated. In the display apparatus 100 according to the exemplary embodiment of the present disclosure, the plurality of remaining gate drivers, other than the emission driver, is configured in the same way so that a detailed description will be omitted.

Referring to FIG. 5, the plurality of gate blocks GB may include a first gate block GB1 and a second gate block GB2.

In the first gate block GB1, the first gate driver may be divided to be disposed, among the plurality of gate blocks GB. For example, the first gate block GB1 is configured by three blocks and configurations of the first gate driver may be divided to be disposed in three blocks. The first gate block GB1 may include a 1-1-th gate block GB1-1, a 1-2-th gate block GB1-2, and a 1-3-th gate block GB1-3.

For example, the first gate block GB1 may be disposed so as to correspond to four pixel lines.

In the second gate block GB2, the second gate driver may be divided to be disposed, among the plurality of gate blocks GB. For example, the second gate block GB2 is configured by three blocks and configurations of the second gate driver may be divided to be disposed in three blocks. The second gate block GB2 may include a 2-1-th gate block GB2-1, a 2-2-th gate block GB2-2, and a 2-3-th gate block GB2-3.

The second gate block GB2 may be disposed so as to correspond to four pixel lines next to the pixel lines in which the first gate block GB1 is disposed.

The plurality of first gate link lines GLL1 may be disposed in the active area AA to extend in a first direction. For example, the first direction may be a column direction. The plurality of first gate link lines GLL1 may be disposed in the plurality of first gate blocks GB1 in the column direction and may be electrically connected to each first gate block GB1.

The plurality of first gate link lines GLL1 may include a first gate high signal line HL1, a first gate low signal line LL1, and a first clock line CL1.

The first gate high signal line HL1 may transmit a gate high signal VEH to the plurality of gate drivers. The first gate high signal line HL1 may extend in the 1-1-th gate block GB1-1 in the column direction and may be electrically connected to the 1-1-th gate block GB1-1.

The first gate low signal line LL1 may transmit a gate low signal VEL to the plurality of gate drivers. The first gate low signal line LL1 may extend in the 1-3-th gate block GB1-3 in the column direction and may be electrically connected to the 1-3-th gate block GB1-3.

The first clock line CL1 may transmit a clock signal CLK to the plurality of gate drivers. The first clock line CL1 may extend in the 1-2-th gate block GB1-2 in the column direction and may be electrically connected to the 1-2-th gate block GB1-2.

The plurality of second gate link lines GLL2 extends in a second direction which is different from the first direction and may be electrically connected to the plurality of first gate link lines GLL1. For example, the second direction may be a row direction. The plurality of second gate link lines GLL2 may be connected to the first gate driver and the second gate driver. The plurality of second gate link lines GLL2 may include a second gate high signal line connected to the first gate high signal line HL1, a second gate low signal line connected to the first gate low signal line LL1, and a second clock line connected to the first clock line CL1. For example, the plurality of second gate link lines GLL2 may include a plurality of 2-1-th gate link lines GLL2-1 which connects the first gate driver and a plurality of 2-2-th gate link lines GLL2-2 which connects the second gate driver. The plurality of 2-1-th gate link lines GLL2-1 extends in the row direction to connect the first gate drivers disposed in the same pixel line. For example, the plurality of 2-1-th gate link lines GLL2-1 may electrically connect the 1-1-th gate block GB1-1, the 1-2-th gate block GB1-2, and the 1-3-th gate block GB1-3 disposed in the same pixel line. The plurality of 2-2-th gate link lines GLL2-2 extends in the row direction to connect the second gate drivers disposed in the same pixel line. For example, the plurality of 2-2-th gate link lines GLL2-2 may electrically connect the 2-1-th gate block GB2-1, the 2-2-th gate block GB2-2, and the 2-3-th gate block GB2-3 disposed in the same pixel line.

The plurality of 2-1-th gate link lines GLL2-1 may include a 2-1-th gate high signal line HL2-1, a 2-1-th gate low signal line LL2-1, and a 2-1-th clock line CL2-1. The plurality of 2-2-th gate link lines GLL2-2 may include a 2-2-th gate high signal line HL2-2, a 2-2-th gate low signal line LL2-2, and a 2-2-th clock line CL2-2. The plurality of 2-1-th gate link lines GLL2-1 and the plurality of 2-2-th gate link lines GLL2-2 may be disposed so as to correspond to different pixel lines. For example, the 2-1-th gate high signal line HL2-1, the 2-1-th gate low signal line LL2-1, the 2-1-th clock line CL2-1, the 2-2-th gate high signal line HL2-2, the 2-2-th gate low signal line LL2-2, and the 2-2-th clock line CL2-2 may be disposed so as to correspond to different pixel lines.

The 2-1-th gate high signal line HL2-1 and the 2-2-th gate high signal line HL2-2 may transmit a gate high signal VEH to the plurality of gate drivers. The 2-1-th gate high signal line HL2-1 is electrically connected to the first gate high signal line HL1 and extends in the row direction to be electrically connected to the 1-1-th gate block GB1-1 and the 1-2-th gate block GB1-2 of the first gate block GB1. The 2-2-th gate high signal line HL2-2 is electrically connected to the first gate high signal line HL1 and extends in the row direction to be electrically connected to the 2-1-th gate block GB2-1 and the 2-2-th gate block GB2-2 of the second gate block GB2. The 2-1-th gate high signal line HL2-1 and the 2-2-th gate high signal line HL2-2 may be disposed so as to correspond to a 4N-th pixel line (N is an integer of 1 or higher). For example, the 2-1-th gate high signal line HL2-1 may be disposed so as to correspond to a fourth pixel line PL4 and the 2-2-th gate high signal line HL2-2 may be disposed so as to correspond to an eighth pixel line PL8.

The 2-1-th gate low signal line LL2-1 and the 2-2-th gate low signal line LL2-2 may transmit a gate low signal VEL to the plurality of gate drivers. The 2-1-th gate low signal line LL2-1 is electrically connected to the first gate low signal line LL1 and extends in the row direction. The 2-1-th gate low signal line LL2-1 may be electrically connected to the 1-3-th gate block GB1-3 of the first gate block GB1. The 2-2-th gate low signal line LL2-2 is electrically connected to the first gate low signal line LL1 and extends in the row direction to be electrically connected to the 2-3-th gate block GB2-3 of the second gate block GB2. The 2-1-th gate low signal line LL2-1 and the 2-2-th gate low signal line LL2-2 may be disposed so as to correspond to a 4N-1-th pixel line. For example, the 2-1-th gate low signal line LL2-1 may be disposed so as to correspond to a third pixel line PL3 and the 2-2-th gate low signal line LL2-2 may be disposed so as to correspond to a seventh pixel line PL7.

The 2-1-th clock line CL2-1 and the 2-2-th clock line CL2-2 may transmit a clock signal CLK to the plurality of gate drivers. The 2-1-th clock line CL2-1 is electrically connected to the first clock line CL1 and extends in the row direction to be electrically connected to the 1-1-th gate block GB1-1 and the 1-2-th gate block GB1-2 of the first gate block GB1. The 2-2-th clock line CL2-2 is electrically connected to the first clock line CL1 and extends in the row direction to be electrically connected to the 2-1-th gate block GB2-1 and the 2-2-th gate block GB2-2 of the second gate block GB2. The 2-1-th clock line CL2-1 and the 2-2-th clock line CL2-2 may be disposed so as to correspond to a 4N-2-th pixel line. For example, the 2-1-th clock line CL2-1 may be disposed so as to correspond to a second pixel line PL2 and the 2-2-th clock line CL2-2 may be disposed so as to correspond to a sixth pixel line PL6.

Figure 6:
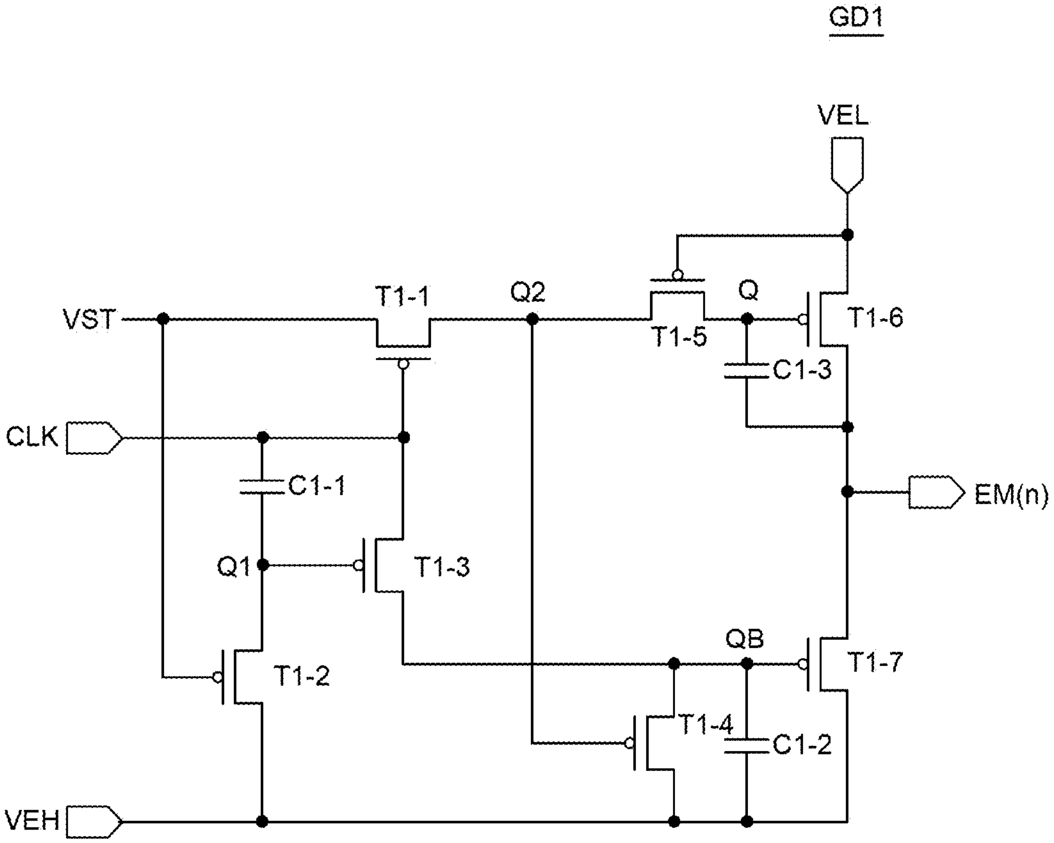
FIG. 6 is an exemplary circuit diagram of a gate driver of a display apparatus according to an exemplary embodiment of the present disclosure.

FIG. 6 is an exemplary circuit diagram of a gate driver of a display apparatus according to an exemplary embodiment of the present disclosure. Even though in FIG. 6, for the convenience of description, a first gate driver, among a plurality of gate drivers is illustrated, a second gate driver may also be configured by the same circuit as the first gate driver. The first gate driver in FIG. 6 is an emission driver which outputs an emission signal EM(n).

Referring to FIG. 6, the first gate driver may include a 1-1-th transistor T1-1, a 1-2-th transistor T1-2, a 1-3-th transistor T1-3, a 1-4-th transistor T1-4, a 1-5-th transistor T1-5, a 1-6-th transistor T1-6, a 1-7-th transistor T1-7, a 1-1-th capacitor C1-1, a 1-2-th capacitor C1-2, and a 1-3-th capacitor C1-3.

The 1-1-th transistor T1-1 may be a p-type MOSFET (PMOS) or may be implemented by a low temperature polycrystalline silicon (LTPS) thin film transistor. The 1-1-th transistor T1-1 may include a source electrode connected to a start signal line to which a start signal VST is supplied, a drain electrode connected to a Q2 node Q2, and a gate electrode connected to a wiring line to which a clock signal CLK is supplied. Therefore, when the 1-1-th transistor T1-1 is turned on in response to the clock signal CLK, the 1-1-th transistor T1-1 applies the start signal VST to the Q2 node Q2.

The 1-2-th transistor T1-2 may be a p-type MOSFET (PMOS) or may be implemented by a low temperature polycrystalline silicon (LTPS) thin film transistor. The 1-2-th transistor T1-2 may include a source electrode connected to a wiring line to which a gate high signal VEH is supplied, a drain electrode connected to a Q1 node Q1, and a gate electrode connected to a start signal line to which a start signal VST is supplied. Therefore, when the 1-2-th transistor T1-2 is turned on in response to the start signal VST, the 1-2-th transistor T1-2 applies a gate high signal VEH to the Q1 node Q1.

The 1-3-th transistor T1-3 may be a p-type MOSFET (PMOS) or may be implemented by a low temperature polycrystalline silicon (LTPS) thin film transistor. The 1-3-th transistor T1-3 may include a source electrode connected to a wiring line to which a clock signal CLK is supplied, a drain electrode connected to a QB node QB, and a gate electrode connected to a Q1 node Q1. Therefore, when the 1-3-th transistor T1-3 is turned on in response to a signal applied to the Q1 node Q1, the 1-3-th transistor applies the clock signal CLK to the QB node QB.

The 1-1-th capacitor C1-1 may be disposed between the wiring line to which the clock signal CLK is supplied and the Q1 node Q1. The 1-1-th capacitor C1-1 may include a first electrode connected to a wiring line to which the clock signal CLK is supplied and a second electrode connected to the Q1 node Q1.

The 1-4-th transistor T1-4 may be a p-type MOSFET (PMOS) or may be implemented by a low temperature polycrystalline silicon (LTPS) thin film transistor. The 1-4-th transistor T1-4 may include a source electrode connected to a wiring line to which a gate high signal VEH is supplied, a drain electrode connected to a QB node QB, and a gate electrode connected to a Q2 node Q2. Therefore, when the 1-4-th transistor T1-4 is turned on in response to a signal applied to the Q2 node Q2, the 1-4-th transistor T1-4 applies the gate high signal VEH to the QB node QB.

The 1-5-th transistor T1-5 may be a p-type MOSFET (PMOS) or may be implemented by a low temperature polycrystalline silicon (LTPS) thin film transistor. The 1-5-th transistor T1-5 may include a source electrode connected to the Q2 node Q2, a drain electrode connected to a Q node Q, and a gate electrode connected to a wiring line to which the gate low signal VEL is supplied. Therefore, the 1-5-th transistor T1-5 maintains the turn-on state by the gate low signal VEL to electrically connect the Q2 node Q2 and the Q node Q.

The 1-6-th transistor T1-6 may be a p-type MOSFET (PMOS) or may be implemented by a low temperature polycrystalline silicon (LTPS) thin film transistor. The 1-6-th transistor T1-6 may include a source electrode connected to a wiring line to which a gate low signal VEL is supplied, a drain electrode connected to an output terminal, and a gate electrode connected to a Q node Q. Therefore, when the 1-6-th transistor T1-6 is turned on in response to a signal applied to the Q node Q, the 1-6-th transistor outputs the gate low signal VEL through the output terminal.

The 1-3-th capacitor C1-3 may be disposed between the gate electrode and the drain electrode of the 1-6-th transistor T1-6. The 1-3-th capacitor C1-3 may include a first electrode connected to the Q node Q and a second electrode connected to an output terminal. The 1-6-th transistor T1-6 and the 1-3-th capacitor C1-3 may be referred to as pull-down circuits.

The 1-7-th transistor T1-7 may be a p-type MOSFET (PMOS) or may be implemented by a low temperature polycrystalline silicon (LTPS) thin film transistor. The 1-7-th transistor T1-7 may include a source electrode connected to a wiring line to which a gate high signal VEH is supplied, a drain electrode connected to an output terminal, and a gate electrode connected to a QB node QB. Therefore, when the 1-7-th transistor T1-7 is turned on in response to a signal applied to the QB node QB, the 1-7-th transistor outputs the gate high signal VEH through the output terminal.

The 1-2-th capacitor C1-2 may be disposed between the QB node and the wiring line to which the gate high signal VEH is supplied. The 1-2-th capacitor C1-2 may include a first electrode connected to the QB node QB and a second electrode connected to the wiring line to which the gate high signal VEH is supplied. The 1-7-th transistor T1-7 and the 1-2-th capacitor C1-2 may be referred to as pull-up circuits.

Figure 7:
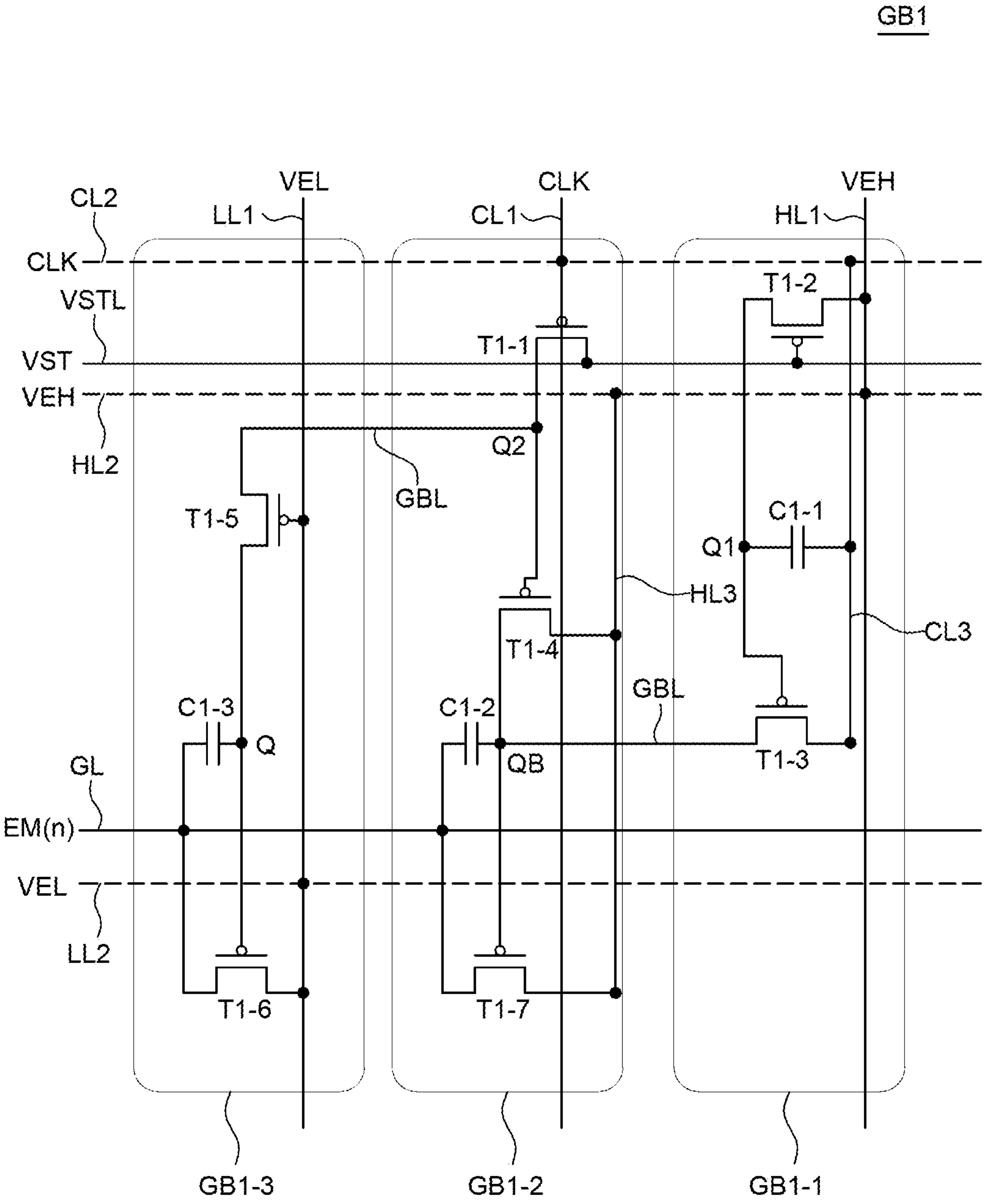
FIG. 7 is a schematic view for explaining a first gate block of a display apparatus according to an exemplary embodiment of the present disclosure.

FIG. 7 is a schematic view for explaining a first gate block of a display apparatus according to an exemplary embodiment of the present disclosure. For the convenience of description, in FIG. 7, only the 1-1-th gate block GB1-1, the 1-2-th gate block GB1-2, and the 1-3-th gate block GB1-3 of the first gate block GB1 are illustrated.

Referring to FIG. 7, in the 1-1-th gate block GB1-1, the 1-2-th gate block GB1-2, and the 1-3-th gate block GB1-3, the 1-1-th transistor T1-1, the 1-2-th transistor T1-2, the 1-3-th transistor T1-3, the 1-4-th transistor T1-4, the 1-5-th transistor T1-5, the 1-6-th transistor T1-6, the 1-7-th transistor T1-7, the 1-1-th capacitor C1-1, the 1-2-th capacitor C1-2, and the 1-3-th capacitor C1-3 of the first gate block GB1 may be disposed to be divided.

In the 1-1-th gate block GB1-1, the 1-2-th transistor T1-2, the 1-3-th transistor T1-3, and the 1-1-th capacitor C1-1 may be disposed.

The source electrode of the 1-2-th transistor T1-2 is connected to the first gate high signal line HL1 to which the first gate high signal VEH is transmitted. Also, the drain electrode of the 1-2-th transistor T1-2 is connected to the Q1 node Q1. The gate electrode of the 1-2-th transistor T1-2 may be connected to the start signal line VSTL to which start signal VST is supplied.

The source electrode of the 1-3-th transistor T1-3 may be connected to the third clock line CL3. The third clock line CL3 extends in the 1-1-th gate block GB1-1 in the column direction and may be connected to the second clock line CL2. The drain electrode of the 1-3-th transistor T1-3 may be connected to the gate block line GBL. The gate block line GBL extends in the row direction to electrically connect the 1-1-th gate block GB1-1 and the 1-2-th gate block GB1-2. For example, the gate block line GBL may connect the drain electrode of the 1-3-th transistor T1-3 and the QB node QB of the 1-2-th gate block GB1-2. The gate electrode of the 1-3-th transistor T1-3 may be connected to the Q1 node Q1.

The first electrode of the 1-1-th capacitor C1-1 is connected to the third clock line CL3 and the second electrode of the 1-1-th capacitor C1-1 may be connected to the Q1 node Q1.

In the 1-2-th gate block GB1-2, the 1-1-th transistor T1-1, the 1-4-th transistor T1-4, the 1-7-th transistor T1-7, and the 1-2-th capacitor C1-2 may be disposed.

The source electrode of the 1-1-th transistor T1-1 is connected to the start signal line VSTL, the drain electrode of the 1-1-th transistor T1-1 is connected to the Q2 node Q2. Also, the gate electrode of the 1-1-th transistor T1-1 is connected to the first clock line CL1 to which the clock signal CLK is transmitted.

The source electrode of the 1-4-th transistor T1-4 is connected to the third gate high signal line HL3 which is electrically connected to the second gate high signal line HL2 to extend in the column direction. The drain electrode of the 1-4-th transistor T1-4 is connected to the QB node QB and the gate electrode of the 1-4-th transistor T1-4 may be connected to the Q2 node Q2.

The source electrode of the 1-7-th transistor T1-7 may be connected to the third gate high signal line HL3. The third gate high signal line HL3 extends in the 1-2-th gate block GB1-2 in the column direction and may be electrically connected to the second gate high signal line HL2. The drain electrode of the 1-7-th transistor T1-7 is connected to the gate line GL to which the emission signal EM(n) is output and the gate electrode of the 1-7-th transistor T1-7 may be connected to the QB node QB.

The first electrode of the 1-2-th capacitor C1-2 is connected to the QB node QB and the second electrode of the 1-2-th capacitor C1-2 may be connected to the gate line GL.

In the 1-3-th gate block GB1-3, a 1-5-th transistor T1-5, a 1-6-th transistor T1-6, and a 1-3-th capacitor C1-3 may be disposed.

The source electrode of the 1-5-th transistor T1-5 may be connected to the gate block line GBL. The gate block line GBL extends in the row direction to electrically connect the 1-2-th gate block GB1-2 and the 1-3-th gate block GB1-3. For example, the gate block line GBL may electrically connect the Q2 node Q2 of the 1-2-th gate block GB1-2 and the source electrode of the 1-5-th transistor T1-5. The drain electrode of the 1-5-th transistor T1-5 is connected to the Q node Q and the gate electrode of the 1-5-th transistor T1-5 may be connected to the first gate low signal line LL1 which transmits the gate low signal VEL.

The source electrode of the 1-6-th transistor T1-6 is connected to the first gate low signal line LL1, the drain electrode of the 1-6-th transistor T1-6 is connected to the gate line GL. Also, the gate electrode of the 1-6-th transistor T1-6 may be connected to the Q node Q.

The first electrode of the 1-3-th capacitor C1-3 is connected to the Q node Q and the second electrode of the 1-3-th capacitor C1-3 may be connected to the gate line GL.

Figure 8:
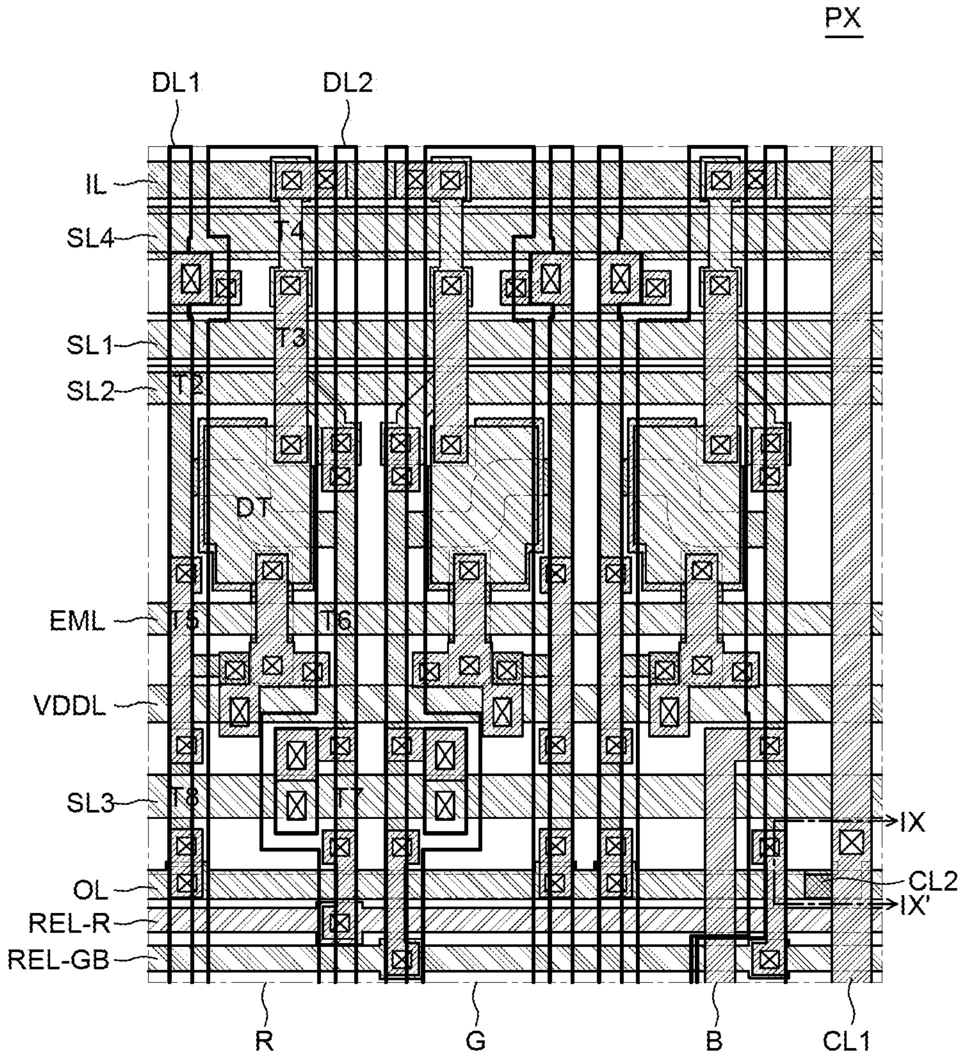
FIG. 8 is an enlarged plan view of one pixel of a display apparatus according to an exemplary embodiment of the present disclosure.

FIG. 8 is an enlarged plan view of one pixel of a display apparatus according to an exemplary embodiment of the present disclosure. In FIG. 8, for the convenience of description, a data line DL, a first scan signal line SL1, a second scan signal line SL2, a third scan signal line SL3, a fourth scan signal line SL4, an emission signal line EML, an initialization signal line IL, a high potential power voltage line VDDL, an on-bias stress voltage line OL, reset voltage lines REL_R and REL_GB, a driving transistor DT, a second transistor T2, a third transistor T3, a fourth transistor T4, a fifth transistor T5, a sixth transistor T6, a seventh transistor T7, and an eighth transistor T8 are illustrated. Hereinafter, a red sub pixel R, a green sub pixel G, and a blue sub pixel B have the same configuration so that the red sub pixel R will be mainly described.

Referring to FIG. 8, a first data line DL1 and a second data line DL2 extending in the column direction may be disposed on the substrate 110.

The first data line DL1 and the second data line DL2 may transmit a data voltage Vdata to the second transistor T2. For example, the first data line DL1 transmits the data voltage Vdata to a plurality of sub pixels disposed in an N-th pixel line. Also, the second data line DL2 may transmit the data voltage Vdata to a plurality of sub pixels disposed in an N+1-th pixel line.

Referring to FIG. 8, a plurality of gate lines GL extending in the row direction may be disposed on the substrate 110. The plurality of gate lines GL may include a first scan signal line SL1, a second scan signal line SL2, a third scan signal line SL3, a fourth scan signal line SL4, and an emission signal line EML. The first scan signal line SL1, the second scan signal line SL2, the third scan signal line SL3, the fourth scan signal line SL4, and the emission signal line EML are spaced apart from each other to be disposed in parallel. The first scan signal line SL1, the second scan signal line SL2, the third scan signal line SL3, the fourth scan signal line SL4, and the emission signal line EML are disposed on the same layer on the substrate 110 and may be formed of the same material. For example, the first scan signal line SL1, the second scan signal line SL2, the third scan signal line SL3, the fourth scan signal line SL4, and the emission signal line EML may be formed of a conductive material, such as copper (Cu), aluminum (Al), molybdenum (Mo), nickel (Ni), titanium (Ti), chrome (Cr), or an alloy thereof, but are not limited thereto.

Referring to FIG. 8, a plurality of constant voltage lines extending in the row direction may be disposed on the substrate 110. The plurality of constant voltage lines may include an initialization signal line IL, a high potential power voltage line VDDL, an on-bias stress voltage line OL, and reset voltage lines REL_R and REL_GB.

The initialization signal line IL, the high potential power voltage line VDDL, the on-bias stress voltage line OL, and the reset voltage lines REL_R and REL_GB are spaced apart from each other to be disposed in parallel. The initialization signal line IL, the high potential power voltage line VDDL, the on-bias stress voltage line OL, and the reset voltage lines REL_R and REL_GB are disposed on the same layer on the substrate 110 and may be formed of the same material. For example, the initialization signal line IL, the high potential power voltage line VDDL, the on-bias stress voltage line OL, and the reset voltage lines REL_R and REL_GB may be configured by a conductive material such as copper (Cu), aluminum (Al), molybdenum (Mo), nickel (Ni), titanium (Ti), chrome (Cr), or an alloy thereof, but are not limited thereto.

The initialization signal line IL extends in the row direction to transmit an initialization signal Vini to the plurality of sub pixels R, G, and B.

The high potential power voltage line VDDL extends in the row direction to transmit a high potential power voltage VDD to the plurality of sub pixels R, G, and B.

The on-bias stress voltage line OL extends in the row direction to transmit an on-bias stress voltage Vobs to the plurality of sub pixels R, G, and B.

The reset voltage lines REL_R and REL_GB may include a red reset voltage line REL_R and a blue green reset voltage line REL_GB. The red reset voltage line REL_R extends in the row direction to transmit a reset voltage VAR to the red sub pixel R. The blue green reset voltage line REL_GB extends in the row direction to transmit a reset voltage VAR to the blue sub pixel B and the green sub pixel G.

Referring to FIG. 8, in each sub pixel R, G, B, a driving transistor DT, a second transistor T2, a third transistor T3, a fourth transistor T4, a fifth transistor T5, a sixth transistor T6, a seventh transistor T7, and an eighth transistor T8 may be disposed.

A source electrode of the driving transistor DT is connected to a drain electrode of the second transistor T2 and a drain electrode of the fifth transistor T5. A drain electrode of the driving transistor DT is connected to a drain electrode of the third transistor T3 and a source electrode of the sixth transistor T6. A gate electrode of the driving transistor DT may be connected to a source electrode of the third transistor T3.

A source electrode of the second transistor T2 is connected to a first data line DL1 through a contact hole and the drain electrode of the second transistor T2 is connected to the drain electrode of the fifth transistor T5 and the source electrode of the driving transistor DT. A gate electrode of the second transistor T2 may be a part of the second scan signal line SL2.

The source electrode of the third transistor T3 is connected to the drain electrode of the fourth transistor T4, the drain electrode of the third transistor T3 is connected to the drain electrode of the driving transistor DT, and a gate electrode of the third transistor T3 may be a part of the first scan signal line SL1.

A source electrode of the fourth transistor T4 is connected to the initialization signal line IL through a contact hole, the drain electrode of the fourth transistor T4 is connected to the source electrode of the third transistor T3, and a gate electrode of the fourth transistor T4 may be a part of a fourth scan signal line SLA.

A source electrode of the fifth transistor T5 is connected to the high potential power voltage line VDDL, the drain electrode of the fifth transistor T5 is connected to the drain electrode of the second transistor T2 and the source electrode of the driving transistor DT, and a gate electrode of the fifth transistor T5 may be a part of the emission signal line EML.

The source electrode of the sixth transistor T6 is connected to the drain electrode of the driving transistor DT, a drain electrode of the sixth transistor T6 is connected to a drain electrode of the seventh transistor T7, and a gate electrode of the sixth transistor T6 may be a part of the emission signal line EML.

A source electrode of the seventh transistor T7 is connected to a red reset voltage line REL_R, the drain electrode of the seventh transistor T7 is connected to the drain electrode of the sixth transistor T6, and a gate electrode of the seventh transistor T7 may be a part of a third scan signal line SL3.

A source electrode of the eighth transistor T8 is connected to the on-bias stress voltage line OL and a drain electrode of the eighth transistor T8 is connected to the source electrode of the driving transistor DT and the drain electrode of the fifth transistor T5. A gate electrode of the eighth transistor T8 may be a part of the third scan signal line SL3.

Referring to FIG. 8, a first gate link line GLL1 extending in the column direction and a second gate link line GLL2 extending in the row direction may be disposed on the substrate 110. For example, a first clock line CL1 extending in the column direction and a second clock line CL2 extending in the row direction may be disposed on the substrate 110.

The first gate link line GLL1 may be electrically connected to the second gate link line GLL2 through a contact hole. For example, the first clock line CL1 may be electrically connected to the second clock line CL2.

The second gate link line GLL2 may be disposed so as to overlap a plurality of constant voltage lines extending in the row direction. The second gate link line GLL2 may be disposed below the constant voltage line. The plurality of constant voltage lines may be wiring lines to which an on-bias stress voltage Vobs or a reset voltage VAR is applied. For example, the constant voltage line which overlaps the second gate link line GLL2 which is disposed therebelow may be any one of an on-bias stress voltage line OL or reset voltage lines REL_R and REL_GB. For example, the second clock line CL2 may be disposed below the on-bias stress voltage line OL to overlap the on-bias stress voltage line OL. However, in FIG. 8, it is illustrated that the second gate link line GLL2 is disposed below the on-bias stress voltage line OL so as to overlap the on-bias stress voltage line OL, but it is not limited thereto. The second gate link line GLL2 may be disposed so as to overlap any one of the reset voltage lines REL_R and REL_GB below any one of the reset voltage lines REL_R and REL_GB.

Figure 9:
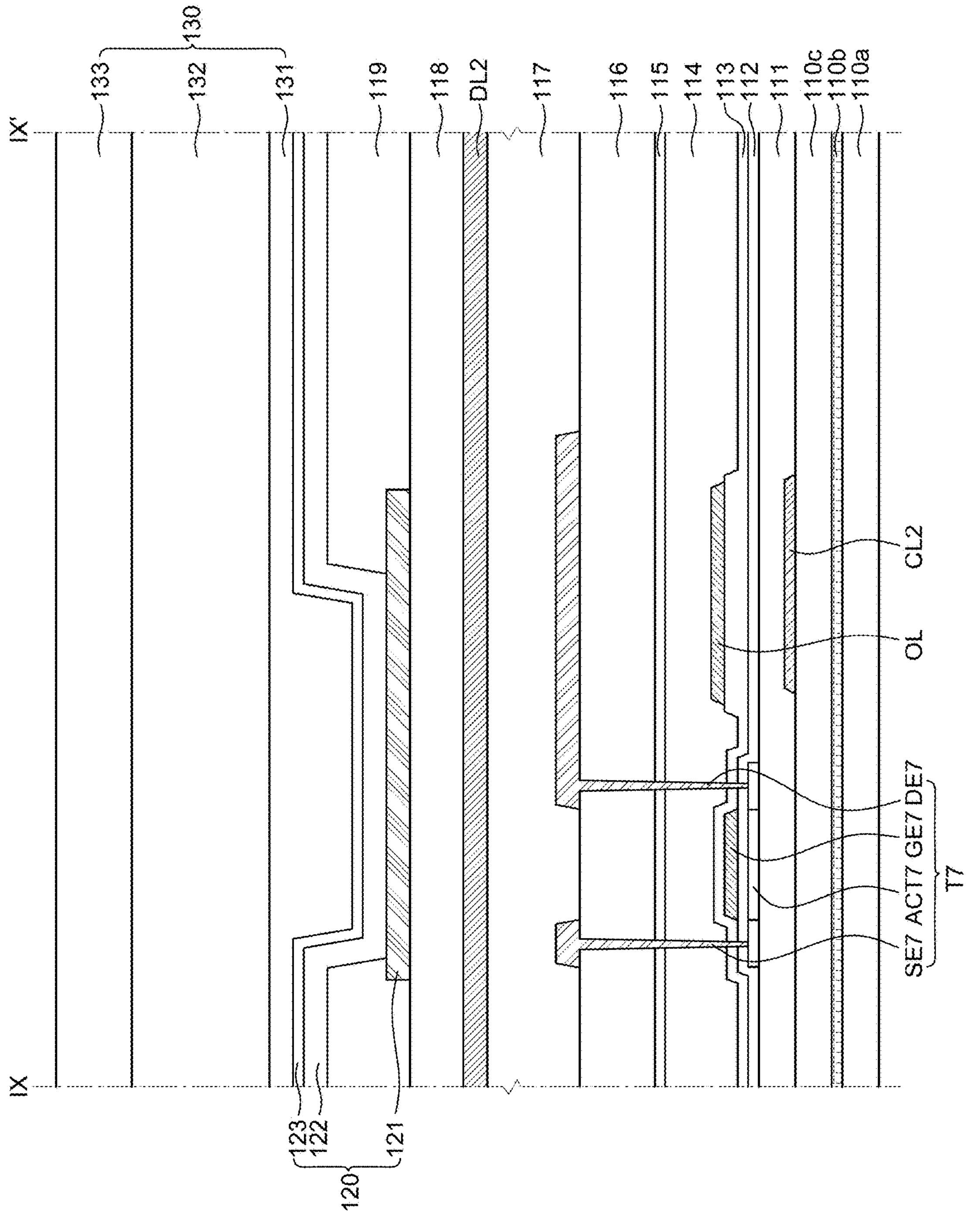
FIG. 9 is a cross-sectional view taken along IX-IX' of FIG. 8.

FIG. 9 is a cross-sectional view taken along IX-IX' of FIG. 8. In FIG. 9, for the convenience of description, only a substrate 110, a second clock line CL2, a first buffer layer 111, a seventh transistor T7, a first gate insulating layer 112, a first interlayer insulating layer 113, an on-bias stress voltage line OL, a second buffer layer 114, a second gate insulating layer 115, a second interlayer insulating layer 116, a first planarization layer 117, a second data line DL2, a second planarization layer 118, a light emitting diode 120, a bank layer 119, and an encapsulation layer 130 are illustrated. Hereinafter, the remaining configuration excluding the second clock line CL2, the seventh transistor T7, the on-bias stress voltage line OL, and the second data line DL2 is the same as that of FIG. 3 so that a detailed description will be omitted.

Referring to FIG. 9, the seventh transistor T7 may be disposed on the substrate 110. The seventh transistor T7 may be disposed on the first buffer layer 111. The seventh transistor T7 may include a seventh active layer ACT7, a seventh gate electrode GE7, a seventh source electrode SE7, and a seventh drain electrode DE7. The seventh active layer ACT7 may be disposed on the first buffer layer 111. The seventh gate electrode GE7 may be disposed on the first gate insulating layer 112 so as to overlap the seventh active layer ACT7. The seventh source electrode SE7 and the seventh drain electrode DE7 are disposed on the second interlayer insulating layer 116 and are connected to a source region and a drain region of the seventh active layer ACT7 through contact holes formed in the first gate insulating layer 112, the first interlayer insulating layer 113, the second buffer layer 114, the second gate insulating layer 115, and the second interlayer insulating layer 116.

Referring to FIG. 9, the second clock line CL2 may be disposed on the substrate 110.

The second gate link line, for example the second clock line CL2 may be disposed on the same layer as the lower protection metal layer BSM and is formed of the same material as the lower protection metal layer BSM. For example, the second clock line CL2 may be formed of any one of molybdenum (Mo), copper (Cu), titanium (Ti), aluminum (Al), chrome (Cr), gold (Au), nickel (Ni), and neodymium (Nd) or an alloy thereof.

Referring to FIG. 9, the on-bias stress voltage line OL may be disposed on the first interlayer insulating layer 113.

The on-bias stress voltage line OL is formed on the same layer as the second capacitor electrode Cst2 and may be formed of the same material as the second capacitor electrode Cst2. For example, the on-bias stress voltage line OL may be formed of any one of molybdenum (Mo), copper (Cu), titanium (Ti), aluminum (Al), chrome (Cr), gold (Au), nickel (Ni), and neodymium (Nd) or an alloy thereof.

That is, the plurality of second gate link lines GLL2 extending in the row direction may be disposed below the plurality of constant voltage lines OL extending in the row direction so as to overlap the plurality of constant voltage lines OL. Therefore, a constant voltage line OL to which a constant voltage level of constant voltage is applied is disposed between the second gate link line GLL2 and a second data line DL2 disposed on the first planarization layer 117 to block the coupling between the second gate link line GLL2 and the second data line DL2. Accordingly, an erroneous operation due to a defect of a signal applied to the second gate link line GLL2 may be suppressed.

In the display apparatus of the related art, the gate driver was disposed in the non-active area around the active area so that the bezel had to increase. Further, in the display apparatus in which the gate driver was disposed in the active area, in order to transmit a clock signal and a control signal which controlled the gate driver to the gate driver disposed in the active area, a plurality of gate link lines was disposed in the row direction in a non-active area on an upper end of a substrate in which a pad connected to the flexible film was disposed, among the non-active areas. In this case, there is a problem in that a bezel has to increase to dispose a plurality of gate link lines.

Therefore, in the display apparatus 100 according to the exemplary embodiment of the present disclosure, a plurality of gate blocks GB in which gate drivers are divided to be disposed in the active area AA is disposed. Further, the pad and the plurality of gate blocks GB are directly connected to the plurality of first gate link lines GLL1 disposed in the column direction. The gate drivers are connected to the plurality of second gate link lines GLL2 which is connected to the plurality of first gate link lines GLL1 to be disposed in the row direction. Accordingly, in the display apparatus 100 according to the exemplary embodiment of the present disclosure, the pad and the plurality of gate blocks GB are directly connected to the plurality of first gate link lines GLL1 and the gate drivers are connected to the plurality of second gate link lines GLL2. Therefore, the gate link line disposed in the non-active area is omitted so that not only left and right bezels, but also a bezel on an upper end of the display apparatus 100 may be reduced or minimized.

In the display apparatus of the related art, when a plurality of gate link lines is disposed in the non-active area of the upper end of the substrate in the row direction, a plurality of additional gate link lines is necessary to connect each gate driver disposed in the active area from the plurality of gate link lines. Therefore, there is a problem in that the number of wiring lines increases. Further, when the number of wiring lines increases, a load due to the wiring line increases, which causes delay of the signal transmission.

Therefore, in the display apparatus 100 according to the exemplary embodiment of the present disclosure, the pad and the plurality of gate blocks GB are directly connected to the plurality of first gate link lines GLL1 which extends in the column direction and the gate drivers are connected to the plurality of second gate link lines GLL2 extending in the row direction. Therefore, the gate link line disposed in the non-active area NA is omitted and the number of wiring lines disposed in the active area AA is reduced so that the load due to the wiring line may be reduced and the delay of the signal transmitted through the wiring line may be improved.

Figure 10:
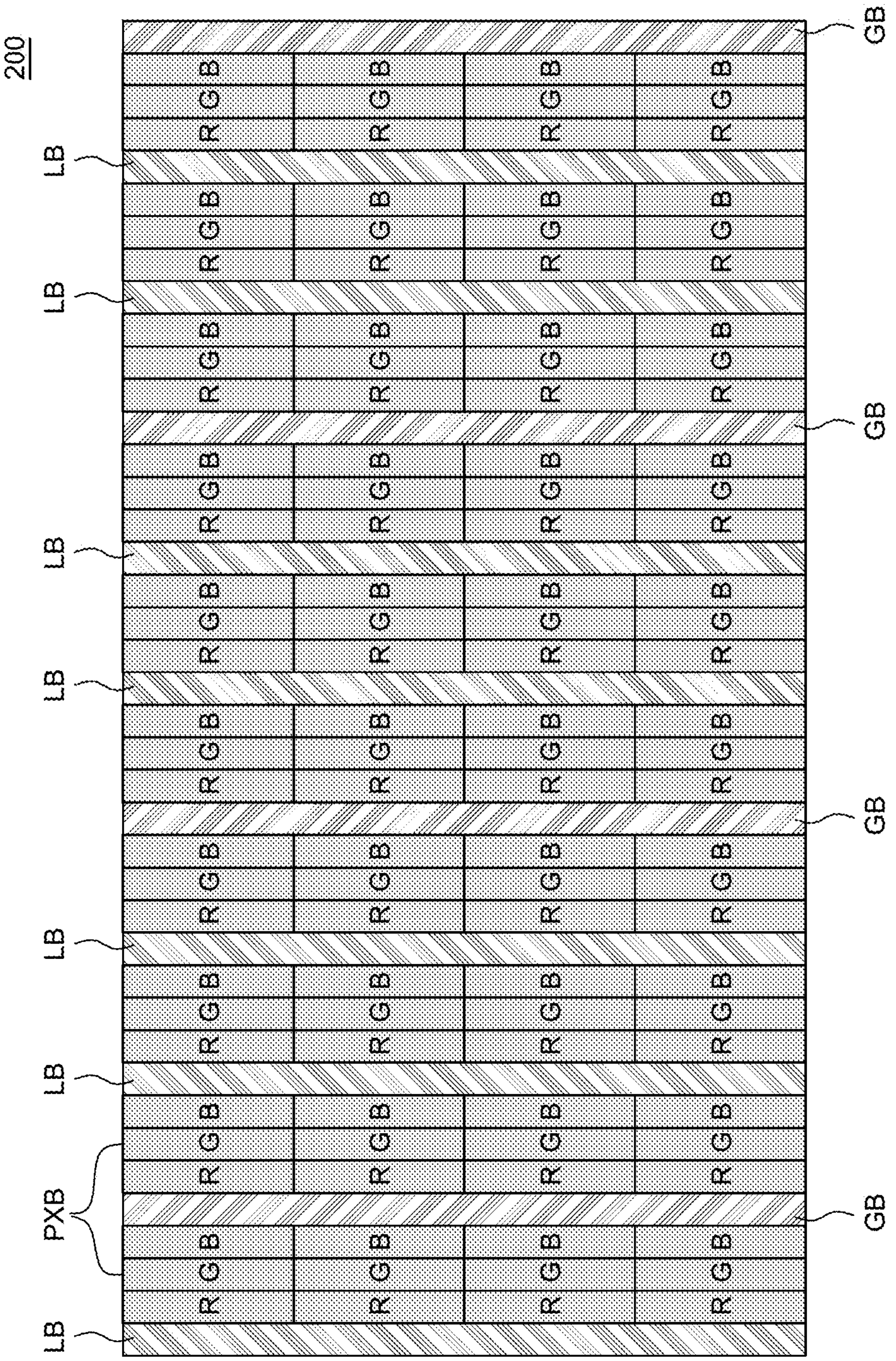
FIG. 10 is a plan view for explaining a part of an active area of a display apparatus according to another exemplary embodiment of the present disclosure.

FIG. 10 is a plan view for explaining a part of an active area of a display apparatus according to another exemplary embodiment of the present disclosure. In FIG. 10, for the convenience of description, only a plurality of pixel blocks PXB, a plurality of gate blocks GB, and a plurality of line blocks LB which are disposed in the active area are illustrated. In FIG. 10, only a plurality of gate blocks GB in which one gate driver, among a plurality of gate drivers is divided to be disposed is illustrated.

A display apparatus 200 according to another exemplary embodiment of the present disclosure has the substantially same configuration as the display apparatus 100 according to the exemplary embodiment of the present disclosure of FIG. 4 except that one gate block GB is added so that a detailed description will be omitted.

Referring to FIG. 10, in the active area AA of the display apparatus 200 according to another exemplary embodiment of the present disclosure, a plurality of pixel blocks PXB, a plurality of gate blocks GB, and a plurality of line blocks LB may be disposed.

Referring to FIG. 10, the plurality of gate block GB may include four gate blocks GB.

In the active area AA, the plurality of pixel blocks PXB, the plurality of gate blocks GB, and the plurality of line blocks LB may be alternately disposed in the row direction. For example, a gate block GB, a pixel block PXB, a line block LB, a pixel block PXB, a line block LB, and a pixel block PXB may be repeatedly disposed in this order from the left side of the active area AA. However, it is not limited thereto and the placement order may be changed in various forms depending on the design.

Figure 11:
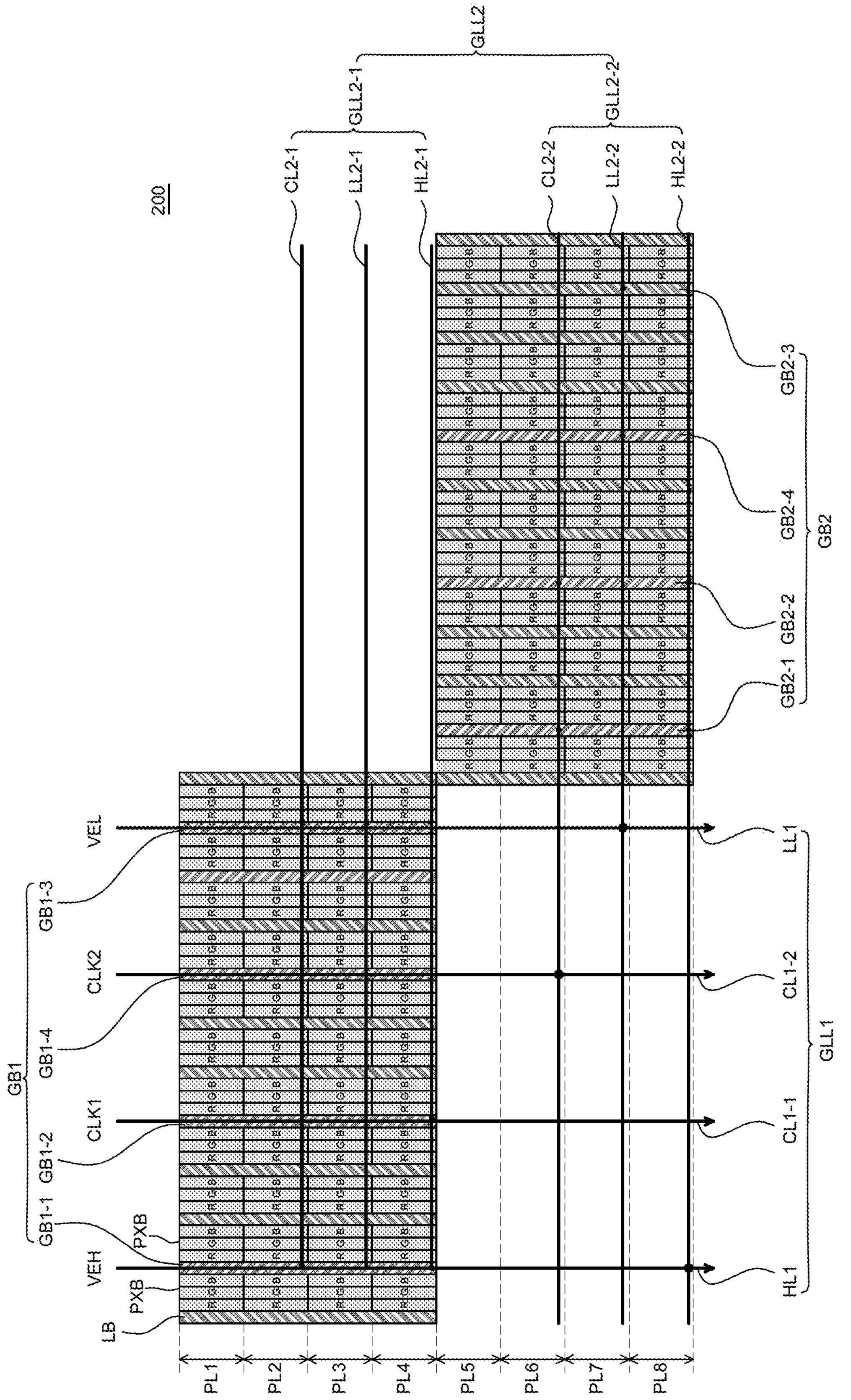
FIG. 11 is a schematic view for explaining a part of an active area of a display apparatus according to another exemplary embodiment of the present disclosure.

FIG. 11 is a schematic view for explaining a part of an active area of a display apparatus according to another exemplary embodiment of the present disclosure. In FIG. 11, for the convenience of description, only a plurality of line blocks LB, a plurality of pixel blocks PXB, a first gate block GB1, a second gate block GB2, a plurality of first gate link lines GLL1, and a plurality of second gate link lines GLL2 are illustrated. In FIG. 11, among the plurality of gate drivers, an emission driver is illustrated. In the display apparatus 200 according to another exemplary embodiment of the present disclosure, the plurality of remaining gate drivers, other than the emission driver, is configured in the same way so that a detailed description will be omitted. Hereinafter, the remaining configuration is the same as the display apparatus 100 according to the exemplary embodiment of the present disclosure of FIG. 5 excluding a 1-4-th gate block GB1-4 and a 2-4-th gate block GB2-4 so that a detailed description will be omitted.

Referring to FIG. 11, the plurality of gate blocks GB may include a first gate block GB1 and a second gate block GB2.

In the first gate block GB1, the first gate driver may be disposed to be divided, among the plurality of gate blocks GB. For example, the first gate block GB1 is configured by four blocks and configurations of the first gate driver may be divided to be disposed in four blocks. The first gate block GB1 may include a 1-1-th gate block GB1-1, a 1-2-th gate block GB1-2, a 1-3-th gate block GB1-3, and a 1-4-th gate block GB1-4. The 1-4-th gate block GB1-4 has the same configuration as the 1-3-th gate block GB1-3 and may be electrically connected to the 1-3-th gate block GB1-3.

For example, the first gate block GB1 may be disposed so as to correspond to four pixel lines.

In the second gate block GB2, the second gate driver may be divided to be disposed in the plurality of gate blocks GB. For example, the second gate block GB2 is configured by four blocks and configurations of the second gate driver may be divided to be disposed in four blocks. The second gate block GB2 may include a 2-1-th gate block GB2-1, a 2-2-th gate block GB2-2, a 2-3-th gate block GB2-3, and a 2-4-th gate block GB2-4. The 2-4-th gate block GB2-4 has the same configuration as the 2-3-th gate block GB2-3 and is electrically connected to the 2-3-th gate block GB2-3.

The second gate block GB2 may be disposed so as to correspond to four pixel lines next to the pixel lines in which the first gate block GB1 is disposed.

The plurality of first gate link lines GLL1 may be disposed in the active area AA to extend in a first direction. For example, the first direction may be a column direction. The plurality of first gate link lines GLL1 is disposed in the plurality of first gate blocks GB1 in the column direction and may be electrically connected to each first gate block GB1.

The plurality of first gate link lines GLL1 may include a first gate high signal line HL1, a first gate low signal line LL1, a first clock line CL1-1, and a second clock line CL1-2.

The first gate high signal line HL1 may transmit a gate high signal VEH to the plurality of gate drivers. The first gate high signal line HL1 may extend in the 1-1-th gate block GB1-1 in the column direction and may be electrically connected to the 1-1-th gate block GB1-1.

The first gate low signal line LL1 may transmit a gate low signal VEL to the plurality of gate drivers. The first gate low signal line LL1 may extend in the 1-3-th gate block GB1-3 in the column direction and may be electrically connected to the 1-3-th gate block GB1-3.

The first clock line CL1-1 and the second clock line CL1-2 may transmit a first clock signal CLK1 and a second clock signal CLK2 to the plurality of gate drivers, respectively. For example, the first clock signal CLK1 and the second clock signal CLK2 may be inverted signals. The first clock line CL1-1 and the second clock line CL1-2 may extend to the 1-2-th gate block GB1-2 and the 1-4-th gate block GB1-4 in the column direction. The first clock line CL1-1 may be electrically connected to the 1-2-th gate block GB1-2.

The plurality of second gate link lines GLL2 extends in a second direction which is different from the first direction and may be electrically connected to the plurality of first gate link lines GLL1. For example, the second direction may be a row direction. The plurality of second gate link lines GLL2 may be connected to the first gate driver and the second gate driver. The plurality of second gate link lines GLL2 may include a plurality of 2-1-th gate link lines GLL2-1 which connects the first gate driver and a plurality of 2-2-th gate link lines GLL2-2 which connects the second gate driver. The plurality of 2-1-th gate link lines GLL2-1 extends in the row direction to connect the first gate drivers disposed in the same pixel line. For example, the plurality of 2-1-th gate link lines GLL2-1 may electrically connect a 1-1-th gate block GB1-1, a 1-2-th gate block GB1-2, a 1-3-th gate block GB1-3, and a 1-4-th gate block GB1-4 disposed in the same pixel line. The plurality of 2-2-th gate link lines GLL2-2 extends in the row direction to connect the second gate drivers disposed in the same pixel line. The plurality of 2-2-th gate link lines GLL2-2 may electrically connect a 2-1-th gate block GB2-1, a 2-2-th gate block GB2-2, a 2-3-th gate block GB2-3, and a 2-4-th gate block GB2-4 disposed in the same pixel line.

The plurality of 2-1-th gate link lines GLL2-1 may include a 2-1-th gate high signal line HL2-1, a 2-1-th gate low signal line LL2-1, and a 2-1-th clock line CL2-1. The plurality of 2-2-th gate link lines GLL2-2 may include a 2-2-th gate high signal line HL2-2, a 2-2-th gate low signal line LL2-2, and a 2-2-th clock line CL2-2. The plurality of 2-1-th gate link lines GLL2-1 and the plurality of 2-2-th gate link lines GLL2-2 may be disposed so as to correspond to different pixel lines. For example, the 2-1-th gate high signal line HL2-1, the 2-1-th gate low signal line LL2-1, the 2-1-th clock line CL2-1, 2-2-th gate high signal line HL2-2, the 2-2-th gate low signal line LL2-2, and the 2-2-th clock line CL2-2 may be disposed so as to correspond to different pixel lines.

The 2-1-th gate high signal line HL2-1 may transmit a gate high signal VEH to the plurality of gate drivers. The 2-1-th gate high signal line HL2-1 is electrically connected to the first gate high signal line HL1 and extends in the row direction to be electrically connected to the 1-1-th gate block GB1-1 and the 1-2-th gate block GB1-2 of the first gate block GB1. The 2-2-th gate high signal line HL2-2 is electrically connected to the first gate high signal line HL1 and extends in the row direction to be electrically connected to the 2-1-th gate block GB2-1 and the 2-2-th gate block GB2-2 of the second gate block GB2. The 2-1-th gate high signal line HL2-1 and the 2-2-th gate high signal line HL2-2 may be disposed so as to correspond to a 4N-th pixel line. For example, the 2-1-th gate high signal line HL2-1 may be disposed so as to correspond to a fourth pixel line PL4 and the 2-2-th gate high signal line HL2-2 may be disposed so as to correspond to an eighth pixel line PL8.

The 2-1-th gate low signal line LL2-1 may transmit a gate low signal VEL to the plurality of gate drivers. The 2-1-th gate low signal line LL2-1 is electrically connected to the first gate low signal line LL1 and may extend in the row direction. The 2-1-th gate low signal line LL2-1 may be electrically connected to the 1-4-th gate block GB1-4 of the first gate block GB1. The 2-2-th gate low signal line LL2-2 is electrically connected to the first gate low signal line LL1 and extends in the row direction to be electrically connected to the 2-3-th gate block GB2-3 and the 2-4-th gate block GB2-4 of the second gate block GB2. The 2-1-th gate low signal line LL2-1 and the 2-2-th gate low signal line LL2-2 may be disposed so as to correspond to a 4N-1-th pixel line. For example, the 2-1-th gate low signal line LL2-1 may be disposed so as to correspond to a third pixel line PL3 and the 2-2-th gate low signal line LL2-2 may be disposed so as to correspond to a seventh pixel line PL7.

The 2-1-th clock line CL2-1 may transmit clock signals CLK1 and CLK2 to the plurality of gate drivers. The 2-1-th clock line CL2-1 is electrically connected to the 1-1-th clock line CL1-1 and extends in the row direction to be electrically connected to the 1-1-th gate block GB1-1 and the 1-2-th gate block GB1-2 of the first gate block GB1. The 2-2-th clock line CL2-2 is electrically connected to the 1-2-th clock line CL1-2 and extends in the row direction to be electrically connected to the 2-1-th gate block GB2-1 and the 2-2-th gate block GB2-2 of the second gate block GB2. The 2-1-th clock line CL2-1 and the 2-2-th clock line CL2-2 may be disposed so as to correspond to a 4N-2-th pixel line. For example, the 2-1-th clock line CL2-1 may be disposed so as to correspond to a second pixel line PL2 and the 2-2-th clock line CL2-2 may be disposed so as to correspond to a sixth pixel line PL6.

Figure 12:
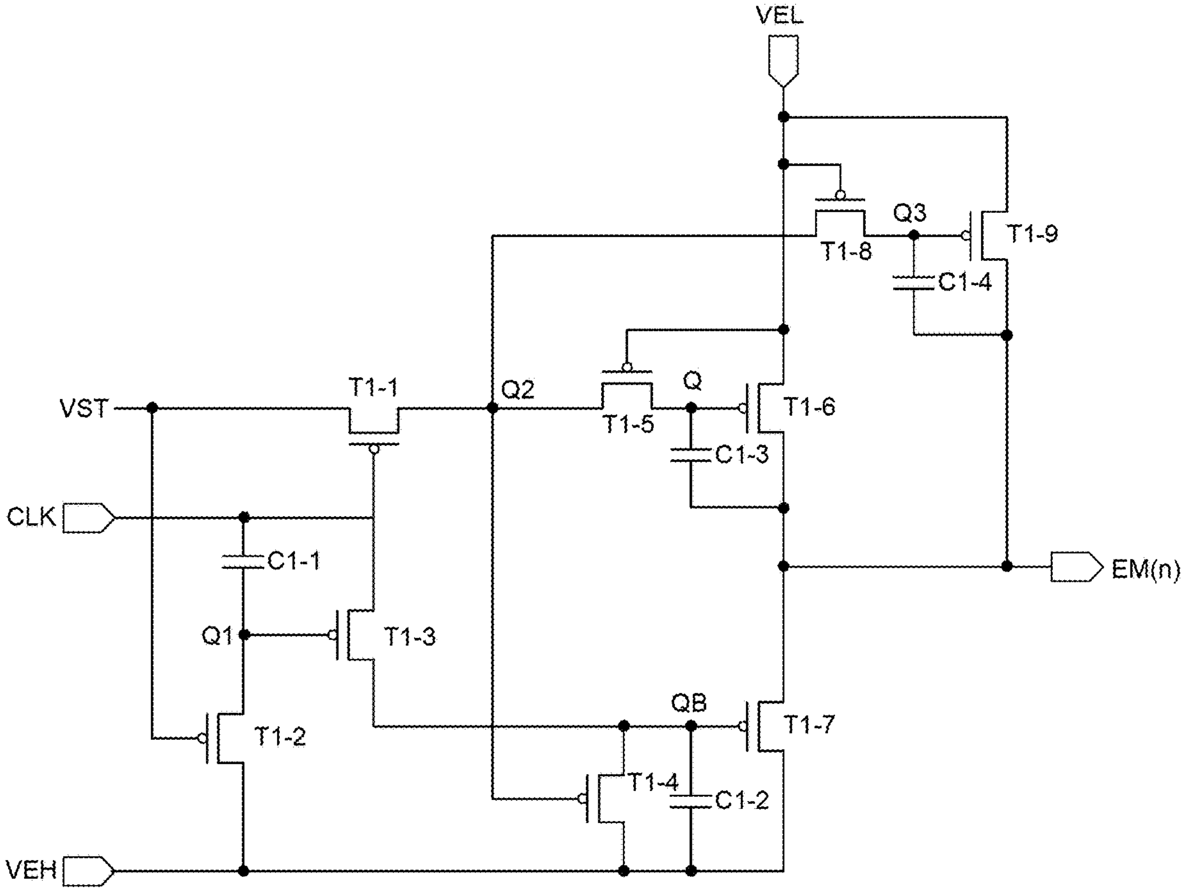
FIG. 12 is an exemplary circuit diagram of a gate driver of a display apparatus according to another exemplary embodiment of the present disclosure.

FIG. 12 is an exemplary circuit diagram of a gate driver of a display apparatus according to another exemplary embodiment of the present disclosure. Even though in FIG. 12, for the convenience of description, a first gate driver, among a plurality of gate drivers is illustrated, a second gate driver may also be configured by the same circuit as the first gate driver. The first gate driver in FIG. 12 is an emission driver which outputs an emission signal EM(n). Hereinafter, the remaining configuration excluding a 1-8-th transistor T1-8, a 1-9-th transistor T1-9, and a 1-4-th capacitor C1-4 is the same as that in FIG. 6 so that a detailed description will be omitted.

Referring to FIG. 12, a first gate driver of a display apparatus 200 according to another exemplary embodiment of the present disclosure may include a 1-1-th transistor T1-1, a 1-2-th transistor T1-2, a 1-3-th transistor T1-3, a 1-4-th transistor T1-4, a 1-5-th transistor T1-5, a 1-6-th transistor T1-6, a 1-7-th transistor T1-7, a 1-8-th transistor T1-8, a 1-9-th transistor T1-9, a 1-1-th capacitor C1-1, a 1-2-th capacitor C1-2, a 1-3-th capacitor C1-3, and a 1-4-th capacitor C1-4.

The 1-8-th transistor T1-8 may be a p-type MOSFET (PMOS) or may be implemented by a low temperature polycrystalline silicon (LTPS) thin film transistor. The 1-8-th transistor T1-8 may include a source electrode connected to the Q2 node Q2, a drain electrode connected to a Q3 node Q3, and a gate electrode connected to a wiring line to which the gate low signal VEL is supplied. Therefore, the 1-8-th transistor T1-8 maintains the turn-on state by the gate low signal VEL to electrically connect the Q2 node Q2 and the Q3 node Q3.

The 1-9-th transistor T1-9 may be a p-type MOSFET (PMOS) or may be implemented by a low temperature polycrystalline silicon (LTPS) thin film transistor. The 1-9-th transistor T1-9 may include a source electrode connected to a wiring line to which a gate low signal VEL is supplied, a drain electrode connected to an output terminal, and a gate electrode connected to a Q3 node Q3. Therefore, when the 1-9-th transistor T1-9 is turned on in response to a signal applied to the Q3 node Q3, the 1-9-th transistor T1-9 outputs the gate low signal VEL through the output terminal.

The 1-4-th capacitor C1-4 may be disposed between the gate electrode and the drain electrode of the 1-9-th transistor T1-9. The 1-4-th capacitor C1-4 may include a first electrode connected to the Q3 node Q3 and a second electrode connected to an output terminal. The 1-9-th transistor T1-9 and the 1-4-th capacitor C1-4 may be referred to as pull-down circuits.

Figure 13:
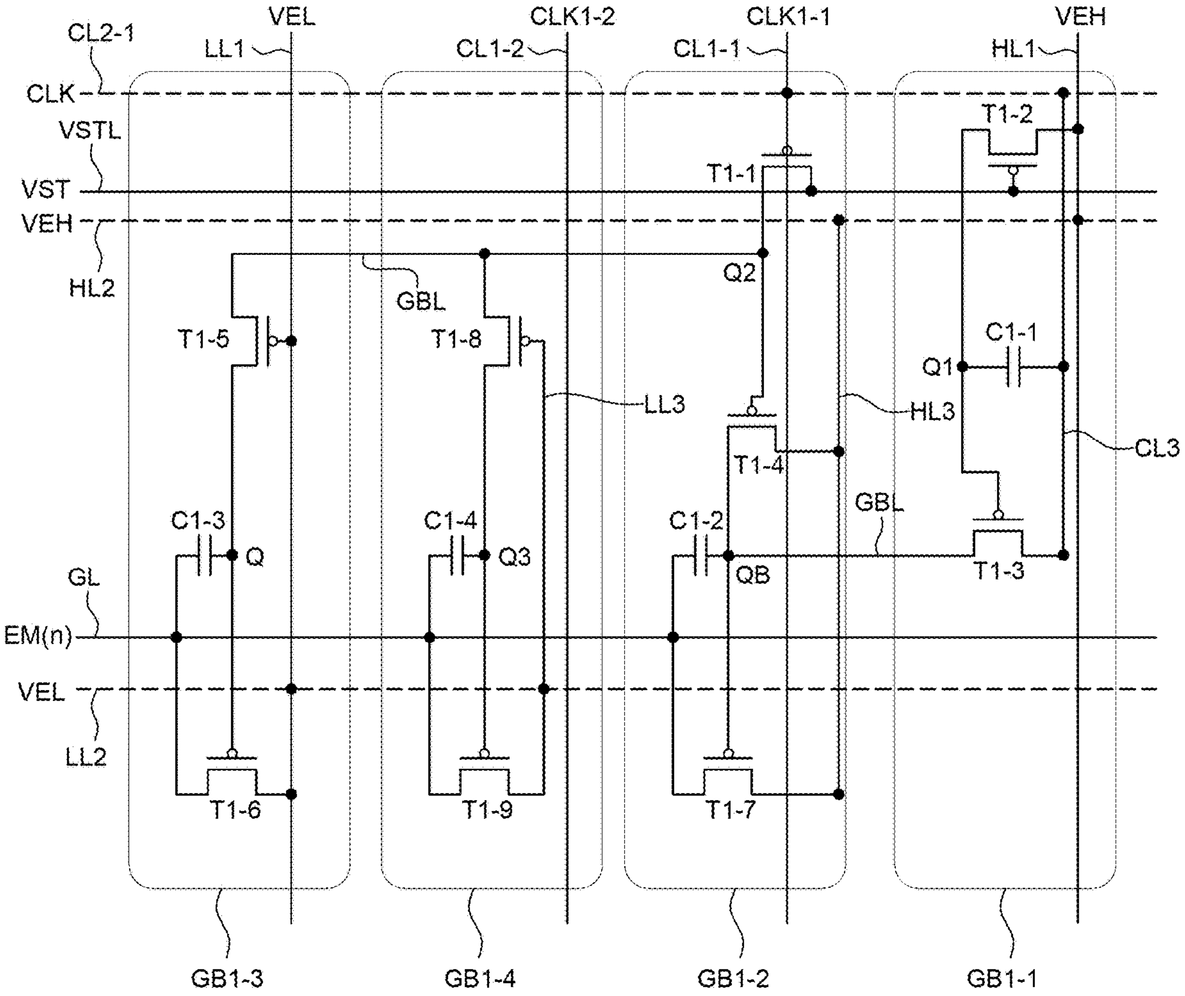
FIG. 13 is a schematic view for explaining a first gate block of a display apparatus according to another exemplary embodiment of the present disclosure.

FIG. 13 is a schematic view for explaining a first gate block of a display apparatus according to another exemplary embodiment of the present disclosure. For the convenience of description, in FIG. 13, only a 1-1-th gate block GB1-1, a 1-2-th gate block GB1-2, a 1-3-th gate block GB1-3, and a 1-4-th gate block GB1-4 of the first gate block GB1 are illustrated. Hereinafter, the remaining configurations excluding the 1-4-th gate block GB 1-4 are the same as those in FIG. 7 so that a detailed description will be omitted.

Referring to FIG. 13, in the 1-1-th gate block GB1-1, the 1-2-th gate block GB1-2, the 1-3-th gate block GB1-3, and the 1-4-th gate block GB1-4, a 1-1-th transistor T1-1, a 1-2-th transistor T1-2, a 1-3-th transistor T1-3, a 1-4-th transistor T1-4, a 1-5-th transistor T1-5, a 1-6-th transistor T1-6, a 1-7-th transistor T1-7, a 1-8-th transistor T1-8, a 1-9-th transistor T1-9, a 1-1-th capacitor C1-1, a 1-2-th capacitor C1-2, a 1-3-th capacitor C1-3, and a 1-4-th capacitor C1-4 of the first gate block GB1 may be divided to be disposed.

In the 1-4-th gate block GB1-4, the 1-8-th transistor T1-8, the 1-9-th transistor T1-9, and the 1-4-th capacitor C1-4 may be disposed.

The source electrode of the 1-8-th transistor T1-8 may be connected to the gate block line GBL. The gate block line GBL extends in the row direction to electrically connect the 1-2-th gate block GB1-2, the 1-3-th gate block GB1-3, and the 1-4-th gate block GB1-4. For example, the gate block line GBL may electrically connect a source electrode of the 1-8-th transistor T1-8, a Q2 node Q2 of the 1-2-th gate block GB1-2, and a source electrode of the 1-5-th transistor T1-5. A drain electrode of the 1-8-th transistor T1-8 is connected to the Q3 node Q3, a gate electrode of the 1-8-th transistor may be connected to a third gate low signal line LL3 connected to a second gate low signal line LL2.

A source electrode of the 1-9-th transistor T1-9 is connected to the second gate low signal line LL2, a drain electrode of the 1-9-th transistor T1-9 is connected to the gate line GL, and a gate electrode of the 1-9-th transistor T1-9 may be connected to the Q3 node Q3.

A first electrode of the 1-4-th capacitor C1-4 is connected to the Q3 node Q3 and a second electrode of the 1-4-th capacitor C1-4 may be connected to the gate line GL.

Therefore, in the display apparatus 200 according to another exemplary embodiment of the present disclosure, a plurality of gate blocks GB in which gate drivers are divided to be disposed in the active area AA is disposed. Further, the pad and the plurality of gate blocks GB are directly connected to the plurality of first gate link lines GLL1 disposed in the column direction. The gate drivers are connected to the plurality of second gate link lines GLL2 which is connected to the plurality of first gate link lines GLL1 to be disposed in the row direction. Accordingly, in the display apparatus 200 according to the exemplary embodiment of the present disclosure, the pad and the plurality of gate blocks GB are directly connected to the plurality of first gate link lines GLL1 and the gate drivers are connected to the plurality of second gate link lines GLL2. Therefore, the gate link line disposed in the non-active area is omitted so that not only left and right bezels, but also a bezel on an upper end of the display apparatus 200 may be reduced or minimized.

Therefore, in the display apparatus 200 according to another exemplary embodiment of the present disclosure, the pad and the plurality of gate blocks GB are directly connected to the plurality of first gate link lines GLL1 which extends in the column direction and the gate drivers are connected to the plurality of second gate link lines GLL2 extending in the row direction. Therefore, the gate link line disposed in the non-active area NA is omitted and the number of wiring lines disposed in the active area AA is reduced so that the load due to the wiring line may be reduced and the delay of the signal transmitted through the wiring line may be improved.

When the gate driver is disposed in the active area, an output power of a gate signal output from the gate driver is low in terms of an area of the active area so that in the case of a pixel spaced apart from the gate driver, there is a problem in that the gate signal is delayed.

Therefore, in the display apparatus 200 according to another exemplary embodiment of the present disclosure, a 1-4-th gate block GB1-4 which is connected to the 1-3-th gate block GB1-3 is additionally configured, and it is configured to be the same as the 1-3-th gate block GB1-3 which outputs a gate signal. Accordingly, as compared with an example that one gate block which outputs a gate signal is used, two gate blocks which output a gate signal are configured to increase an output power of the gate signal output from the gate driver. Further, even in the pixel which is spaced apart from the gate driver, the delay of the gate signal is reduced or minimized to suppress the deviation of the display quality.

A display apparatus according to the exemplary embodiments of the present disclosure can also be described as follows:

A display apparatus according to an exemplary embodiment of the present disclosure includes a substrate including an active area in which a plurality of pixels is disposed and a non-active area which encloses the active area, a plurality of gate drivers which is distributed in the active area and outputs a gate signal, a flexible substrate connected to one side of the non-active area, a plurality of first gate link lines which is connected to the flexible substrate and a first gate driver, among the plurality of gate drivers, and extends in a first direction and a plurality of second gate link lines which is disposed in the active area, extends in a second direction which is different from the first direction, is connected to the plurality of first gate link lines, and is connected to the first gate driver and a second gate driver, among the plurality of gate drivers.

The active area may include a plurality of pixel blocks disposed in the second direction and a plurality of gate blocks which includes the plurality of gate drivers divided to be disposed and is disposed to be parallel to the plurality of pixel blocks.

The plurality of gate blocks may be disposed between the plurality of pixel blocks.

The active area may further include a line block which is disposed to be parallel to the plurality of pixel blocks and is disposed between the plurality of pixel blocks.

The plurality of first gate link lines may include a first gate high signal line, a first gate low signal line, and a first clock line, and the plurality of second gate link lines may include a second gate high signal line connected to the first gate high signal line, a second gate low signal line connected to the first gate low signal line, and a second clock line connected to the first clock line.

The plurality of gate blocks may include a first gate block including a 1-3-th transistor which is connected between the second clock line and a QB node and has a gate electrode connected to the second clock line through a 1-1-th capacitor and a 1-2-th transistor which is connected between the gate electrode of the 1-3-th transistor and the first gate high signal line and has a gate electrode connected to a start signal line, a second gate block including a 1-1-th transistor which is connected between the start signal line and a Q2 node and has a gate electrode connected to the first clock line, a 1-4-th transistor which is connected between the second gate high signal line and the QB node and has a gate electrode connected to the Q2 node, a 1-7-th transistor which is connected between a gate line from which the gate signal is output and the second gate high signal line and has a gate electrode connected to the QB node, and a 1-2-th capacitor connected between the QB node and the 1-7-th transistor and a third gate block including a 1-5-th transistor which is connected between the Q2 node and the Q node and has a gate electrode connected to the first gate low signal line, a 1-6-th transistor which is connected between the first gate low signal line and the gate line and has a gate electrode connected to the Q node, and a 1-3-th capacitor which is connected between the gate electrode of the 1-6-th transistor and the gate line.

The gate block may further include a fourth gate block which has the same configuration as the third gate block and is connected to the third gate block.

The fourth gate block may include a 1-8-th transistor which is connected between the Q2 node and a Q3 node and has a gate electrode connected to the second gate low signal line, a 1-9-th transistor which is connected between the second gate low signal line and the gate line and has a gate electrode connected to the Q3 node and a 1-4-th capacitor which is connected between the gate electrode of the 1-9-th transistor and the gate line.

The display apparatus may further include a plurality of constant voltage lines which extends in the second direction in the active area, the plurality of second gate link lines may be disposed so as to overlap the plurality of constant voltage lines.

An on-bias stress (OBS) voltage or a reset voltage may be applied to the plurality of constant voltage lines.

The plurality of second gate link lines may be disposed below the constant voltage lines.

The display apparatus may further include a plurality of transistors disposed on the substrate and a lower protection metal layer disposed between the substrate and active layers of the plurality of transistors, the plurality of second gate link lines may be disposed on the same layer as the lower protection metal layer.

A display apparatus according to another exemplary embodiment of the present disclosure includes a substrate including an active area in which a plurality of pixels is disposed and a non-active area which encloses the active area, a plurality of gate blocks disposed in the active area in which a plurality of gate drivers which supplies a gate signal to the plurality of pixels is divided to be disposed, a plurality of first gate link lines which is connected to some of the plurality of gate blocks and extends in a first direction and a plurality of second gate link lines which is connected to the plurality of first gate link lines to extend in a second direction which is different from the first direction and is connected to the plurality of gate blocks.

The plurality of first gate link lines may include a first gate high signal line, a first gate low signal line, and a first clock line, and the plurality of second gate link lines may include a second gate high signal line connected to the first gate high signal line, a second gate low signal line connected to the first gate low signal line, and a second clock line connected to the first clock line.

The plurality of gate blocks may include a first gate block including a 1-3-th transistor which is connected between the second clock line and a QB node and has a gate electrode connected to the second clock line through a 1-1-th capacitor and a 1-2-th transistor which is connected between the gate electrode of the 1-3-th transistor and the first gate high signal line and has a gate electrode connected to a start signal line, a second gate block including a 1-1-th transistor which is connected between a start signal line and a Q2 node and has a gate electrode connected to the first clock line, a 1-4-th transistor which is connected between the second gate high signal line and the QB node and has a gate electrode connected to the Q2 node, a 1-7-th transistor which is connected between a gate line from which the gate signal is output and the second gate high signal line and has a gate electrode connected to the QB node, and a 1-2-th capacitor connected between the QB node and the 1-7-th transistor and a third gate block including a 1-5-th transistor which is connected between the Q2 node and the Q node and has a gate electrode connected to the first gate low signal line, a 1-6-th transistor which is connected between the first gate low signal line and the gate line and has a gate electrode connected to the Q node, and a 1-3-th capacitor which is connected between the gate electrode of the 1-6-th transistor and the gate line.

The gate block may further include a fourth gate block which is connected to the third gate block, and the fourth gate block may include a 1-8-th transistor which is connected between the Q2 node and the Q3 node and has a gate electrode connected to the second gate low signal line, a 1-9-th transistor which is connected between the second gate low signal line and the gate line and has a gate electrode connected to the Q3 node and a 1-4-th capacitor which is connected between the gate electrode of the 1-9-th transistor and the gate line.

The display apparatus may further include a plurality of constant voltage lines which extends in the second direction in the active area, wherein the plurality of second gate link lines is disposed so as to overlap the plurality of constant voltage lines.

The display apparatus may further include a plurality of transistors disposed on the substrate and a lower protection metal layer disposed between the substrate and an active layer of the plurality of transistors, the plurality of second gate link lines may be disposed on the same layer as the lower protection metal layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:

a substrate including an active area in which a plurality of pixels is disposed and a non-active area;

a plurality of gate drivers each having gate driving transistors distributed throughout the active area and adjacent to the plurality of pixels, the plurality of gate drivers being configured to output a gate signal;

a flexible substrate connected to one side of the non-active area;

a plurality of first gate link lines which is connected to the flexible substrate and a first gate driver, among the plurality of gate drivers, and extends in a first direction;

a plurality of second gate link lines which is disposed in the active area, extends in a second direction which is different from the first direction, is connected to the plurality of first gate link lines, and is connected to a first gate driver and a second gate driver, among the plurality of gate drivers; and a plurality of constant voltage lines configured to supply a constant voltage to the plurality of pixels, and extending in the second direction in an active area, wherein the plurality of second gate link lines is disposed so as to overlap the plurality of constant voltage lines.

2. The display apparatus according to claim 1, wherein the active area includes:

a plurality of pixel blocks disposed in the second direction; and a plurality of gate blocks which includes the plurality of gate drivers divided to be disposed and is disposed to be parallel to the plurality of pixel blocks.

3. The display apparatus according to claim 2, wherein the plurality of gate blocks is disposed between the plurality of pixel blocks.

4. The display apparatus according to claim 2, wherein the active area further includes a line block which is disposed to be parallel to the plurality of pixel blocks and is disposed between the plurality of pixel blocks.

5. The display apparatus according to claim 2, wherein the plurality of first gate link lines includes:

a first gate high signal line, a first gate low signal line, and a first clock line, and wherein the plurality of second gate link lines includes:

a second gate high signal line connected to the first gate high signal line, a second gate low signal line connected to the first gate low signal line, and a second clock line connected to the first clock line.

6. The display apparatus according to claim 5, wherein the gate driving transistors include transistors disposed in the plurality of gate blocks, and the plurality of gate blocks includes:

a first gate block including a 1-3-th transistor which is connected between the second clock line and a QB node and has a gate electrode connected to the second clock line through a 1-1-th capacitor and a 1-2-th transistor which is connected between the gate electrode of the 1-3-th transistor and the first gate high signal line and has a gate electrode connected to a start signal line; and a second gate block including a 1-1-th transistor which is connected between the start signal line and a Q2 node and has a gate electrode connected to the first clock line, a 1-4-th transistor which is connected between the second gate high signal line and the QB node and has a gate electrode connected to the Q2 node, a 1-7-th transistor which is connected between a gate line from which the gate signal is output and the second gate high signal line and has a gate electrode connected to the QB node, and a 1-2-th capacitor connected between the QB node and the 1-7-th transistor; and a third gate block including a 1-5-th transistor which is connected between the Q2 node and the Q node and has a gate electrode connected to the first gate low signal line, a 1-6-th transistor which is connected between the first gate low signal line and the gate line and has a gate electrode connected to the Q node, and a 1-3-th capacitor which is connected between the gate electrode of the 1-6-th transistor and the gate line.

7. The display apparatus according to claim 6, wherein the gate block further includes a fourth gate block which has the same configuration as the third gate block and is connected to the third gate block.

8. The display apparatus according to claim 7, wherein the fourth gate block includes:

a 1-8-th transistor which is connected between the Q2 node and a Q3 node and has a gate electrode connected to the second gate low signal line;

a 1-9-th transistor which is connected between the second gate low signal line and the gate line and has a gate electrode connected to the Q3 node; and a 1-4-th capacitor which is connected between the gate electrode of the 1-9-th transistor and the gate line.

9. The display apparatus according to claim 1, wherein either an on-bias stress voltage or a reset voltage is applied to the plurality of constant voltage lines.

10. The display apparatus according to claim 1, wherein the plurality of second gate link lines is disposed below the constant voltage lines.

11. The display apparatus according to claim 1, further comprising:

a plurality of transistors disposed on the substrate; and a lower protection metal layer disposed between the substrate and active layers of the plurality of transistors, wherein the plurality of second gate link lines is disposed on the same layer as the lower protection metal layer.

12. The display apparatus according to claim 2, wherein the plurality of second gate link lines include a plurality of 2-1-th gate link lines which connects the first gate driver and a plurality of 2-2-th gate link lines which connects the second gate driver, wherein the plurality of 2-1-th gate link lines include a 2-1-th gate high signal line, a 2-1-th gate low signal line, and a 2-1-th clock line, wherein the plurality of 2-2-th gate link lines include a 2-2-th gate high signal line, a 2-2-th gate low signal line, and a 2-2-th clock line, wherein each gate block corresponds to four pixel lines, and wherein the 2-1-th gate high signal line, the 2-1-th gate low signal line, the 2-1-th clock line, the 2-2-th gate high signal line, the 2-2-th gate low signal line, and the 2-2-th clock line are disposed so as to correspond to different pixel lines.

13. A display apparatus, comprising:

a substrate including an active area in which a plurality of pixels is disposed and a non-active area adjacent to the active area;

a plurality of gate blocks disposed in the active area in which a plurality of gate drivers which supplies a gate signal to the plurality of pixels is divided to be disposed, the plurality of gate drivers each having gate driving transistors distributed throughout the active area and adjacent to the plurality of pixels;

a plurality of first gate link lines which is connected to some of the plurality of gate blocks and extends in a first direction;

a plurality of second gate link lines which is connected to the plurality of first gate link lines to extend in a second direction which is different from the first direction and is connected to the plurality of gate blocks;

a plurality of constant voltage lines configured to supply a constant voltage to the plurality of pixels, and extending in the second direction in an active area, wherein the plurality of second gate link lines is disposed so as to overlap the plurality of constant voltage lines.

14. The display apparatus according to claim 13, wherein the plurality of first gate link lines includes:

a first gate high signal line, a first gate low signal line, and a first clock line, and wherein the plurality of second gate link lines includes:

a second gate high signal line connected to the first gate high signal line, a second gate low signal line connected to the first gate low signal line, and a second clock line connected to the first clock line.

15. The display apparatus according to claim 14, wherein the gate driving transistors include transistors disposed in the plurality of gate blocks, and the plurality of gate blocks includes:

a first gate block including a 1-3-th transistor which is connected between the second clock line and a QB node and has a gate electrode connected to the second clock line through a 1-1-th capacitor and a 1-2-th transistor which is connected between the gate electrode of the 1-3-th transistor and the first gate high signal line and has a gate electrode connected to a start signal line;

a second gate block including a 1-1-th transistor which is connected between the start signal line and a Q2 node and has a gate electrode connected to the first clock line, a 1-4-th transistor which is connected between the second gate high signal line and the QB node and has a gate electrode connected to the Q2 node, a 1-7-th transistor which is connected between a gate line from which the gate signal is output and the second gate high signal line and has a gate electrode connected to the QB node, and a 1-2-th capacitor connected between the QB node and the 1-7-th transistor; and a third gate block including a 1-5-th transistor which is connected between the Q2 node and a Q node and has a gate electrode connected to the first gate low signal line, a 1-6-th transistor which is connected between the first gate low signal line and the gate line and has a gate electrode connected to the Q node, and a 1-3-th capacitor which is connected between the gate electrode of the 1-6-th transistor and the gate line.

16. The display apparatus according to claim 15, wherein the gate block further includes a fourth gate block which is connected to the third gate block, and the fourth gate block includes:

a 1-8-th transistor which is connected between the Q2 node and a Q3 node and has a gate electrode connected to the second gate low signal line;

a 1-9-th transistor which is connected between the second gate low signal line and the gate line and has a gate electrode connected to the Q3 node; and a 1-4-th capacitor which is connected between the gate electrode of the 1-9-th transistor and the gate line.

17. The display apparatus according to claim 12, further comprising:

a plurality of constant voltage lines which extends in the second direction in the active area, wherein the plurality of second gate link lines is disposed so as to overlap the plurality of constant voltage lines.

18. The display apparatus according to claim 16, further comprising:

a plurality of transistors disposed on the substrate; and a lower protection metal layer disposed between the substrate and an active layer of the plurality of transistors, wherein the plurality of second gate link lines is disposed on the same layer as the lower protection metal layer.

19. The display apparatus according to claim 16, wherein the plurality of second gate link lines include a plurality of 2-1-th gate link lines which connects a first gate driver in the plurality of gate drivers and a plurality of 2-2-th gate link lines which connects a second gate driver in the plurality of gate drivers, wherein the plurality of 2-1-th gate link lines include a 2-1-th gate high signal line, a 2-1-th gate low signal line, and a 2-1-th clock line, wherein the plurality of 2-2-th gate link lines include a 2-2-th gate high signal line, a 2-2-th gate low signal line, and a 2-2-th clock line, wherein each gate block corresponds to four pixel lines, and wherein the 2-1-th gate high signal line, the 2-1-th gate low signal line, the 2-1-th clock line, the 2-2-th gate high signal line, the 2-2-th gate low signal line, and the 2-2-th clock line are disposed so as to correspond to different pixel lines.

* * * * *